US012635516B2

(12) United States Patent
Hino et al.

(10) Patent No.: US 12,635,516 B2
(45) Date of Patent: May 19, 2026

(54) SEMICONDUCTOR DEVICE WITH ENHANCED BONDING, METHOD OF MANUFACTURING SAME, AND POWER CONVERSION DEVICE

(71) Applicant: Mitsubishi Electric Corporation, Tokyo (JP)

(72) Inventors: Yasunari Hino, Tokyo (JP); Yasuo Tanaka, Tokyo (JP); Shinnosuke Soda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 284 days.

(21) Appl. No.: 18/331,385

(22) Filed: Jun. 8, 2023

(65) Prior Publication Data

US 2024/0030087 A1    Jan. 25, 2024

(30) Foreign Application Priority Data

Jul. 20, 2022    (JP) ................................. 2022-115748

(51) Int. Cl.
     *H01L 23/367*      (2006.01)
     *H01L 21/48*      (2006.01)
     (Continued)

(52) U.S. Cl.
     CPC ...... *H01L 23/3675* (2013.01); *H01L 21/4875* (2013.01); *H01L 23/3735* (2013.01);
     (Continued)

(58) Field of Classification Search
     CPC .. H01L 23/3675; H01L 21/4875; H01L 21/60
     See application file for complete search history.

(56) References Cited

U.S. PATENT DOCUMENTS 3,750,277 A * 8/1973 Happ ................... H01L 21/4821
                                           29/827
5,849,608 A * 12/1998 Abe ..................... H01L 23/4951
                                           257/676

(Continued)

FOREIGN PATENT DOCUMENTS

DE    10 2020 126810 A1    4/2021
JP      2004-303869 A    10/2004

(Continued)

OTHER PUBLICATIONS

An Office Action issued by the German Patent and Trademark Office on Jul. 10, 2024, which corresponds to German Patent Application No. 102023118237.4 and is related to U.S. Appl. No. 18/331,385; with English language translation.

(Continued)

*Primary Examiner* — Quoc D Hoang
(74) *Attorney, Agent, or Firm* — Studebaker Brackett PLLC

(57) ABSTRACT

Provided are a semiconductor device with a bonding strength ensured between an electrode of a semiconductor element and a terminal, and a power conversion device including the semiconductor device. A semiconductor device includes: a semiconductor element having an electrode; a substrate; a terminal; and a bonding material. The terminal has a through hole and has a step portion in the inside of the through hole. The bonding material covers the step portion in the inside of the through hole and is in contact with the electrode of the semiconductor element.

19 Claims, 11 Drawing Sheets

(51) Int. Cl.

| | |
|---|---|
| *H01L 23/373* | (2006.01) |
| *H01L 23/492* | (2006.01) |
| *H01L 23/495* | (2006.01) |
| *H02M 7/5387* | (2007.01) |

(52) U.S. Cl.

CPC ........ *H01L 23/492* (2013.01); *H01L 23/4952* (2013.01); *H01L 23/49562* (2013.01); *H01L 23/49568* (2013.01); *H02M 7/53875* (2013.01)

(56)  References Cited

U.S. PATENT DOCUMENTS

| | | | |
|---|---|---|---|
| 2008/0029888 A1 | 2/2008 | Park et al. | |
| 2013/0277800 A1* | 10/2013 | Hori ...................... | H01G 2/065 257/532 |
| 2017/0092605 A1 | 3/2017 | Tonegawa | |
| 2017/0125319 A1 | 5/2017 | Yanagida | |
| 2017/0178995 A1 | 6/2017 | Hino et al. | |
| 2021/0125904 A1 | 4/2021 | Sugimachi et al. | |

FOREIGN PATENT DOCUMENTS

| | | | |
|---|---|---|---|
| JP | 2010-010173 | A | 1/2010 |
| JP | 2011-204886 | A | 10/2011 |
| JP | 2015-106682 | A | 6/2015 |
| JP | 2017-117846 | A | 6/2017 |
| WO | 2020/110860 | A1 | 6/2020 |

OTHER PUBLICATIONS

An Office Action, "Notice of Reasons for Refusal," mailed by the Japanese Patent Office on Aug. 26, 2025, which corresponds to Japanese Patent Application No. 2022-115748 and is related to U.S. Appl. No. 18/331,385; with English language translation.

An Office Action, "Notice of Reasons for Refusal," mailed by the Japanese Patent Office on Jan. 27, 2026, which corresponds to Japanese Patent Application No. 2022-115748 and is related to U.S. Appl. No. 18/331,385; with English language translation.

* cited by examiner

| STEP OF PREPARING SUBSTRATE AND SEMICONDUCTOR ELEMENT | S1b |
|---|---|

↓

| FIRST MOUNTING STEP | S2b |
|---|---|

↓

| FIRST BONDING STEP | S3b |
|---|---|

↓

| METAL WIRE INTERCONNECTION STEP | S4b |
|---|---|

↓

| SECOND MOUNTING STEP | S5b |
|---|---|

↓

| SECOND BONDING STEP (APPLY) | S6b |
|---|---|

↓

| SEALING STEP | S7b |
|---|---|

SEMICONDUCTOR DEVICE WITH ENHANCED BONDING, METHOD OF MANUFACTURING SAME, AND POWER CONVERSION DEVICE

BACKGROUND OF THE INVENTION

Field of the Invention

The present disclosure relates to a semiconductor device, a method of manufacturing a semiconductor device, and a power conversion device.

Description of the Background Art

With recent movement toward decarbonized society, semiconductor devices typified by power semiconductor devices are used not only in home appliance applications such as air conditioners but also in vehicle applications such as electric cars and hybrid cars, and railroad applications. In a known configuration of such semiconductor devices, for example, a terminal having a through hole and an electrode of a semiconductor element are bonded by a bonding material such as solder and electrically connected in a semiconductor device (for example, see Japanese Patent Laying-Open No. 2017-117846 and Japanese Patent Laying-Open No. 2011-204886).

SUMMARY OF THE INVENTION

However, since the semiconductor devices described above are employed in a wide variety of products, the frequency of use under a high load environment (for example, under a high temperature environment or under a vibrations environment) is increasing. For this reason, high reliability and longer life of semiconductor devices are requested. It is known that the joint section between an electrode on a semiconductor element and a terminal significantly affects the reliability and the life of the semiconductor device.

The present disclosure provides a semiconductor device that solves the problem as described above, and an object of the present disclosure is provide a semiconductor device with a bonding strength ensured between an electrode of a semiconductor element and a terminal, and a power conversion device including the semiconductor device.

A semiconductor device according to the present disclosure includes a semiconductor element, a substrate, a terminal, and a bonding material. The semiconductor element has an electrode. The semiconductor element is mounted on the substrate. The terminal is connected to the electrode of the semiconductor element. The terminal has a through hole having a step portion. The bonding material covers the step portion of the through hole and is in contact with the electrode of the semiconductor element.

A power conversion device according to the present disclosure includes a main conversion circuit, a drive circuit, and a control circuit. The main conversion circuit has the semiconductor device described above. The main conversion circuit converts input power and outputs the converted power. The drive circuit outputs a drive signal for driving the semiconductor device to the semiconductor device. The control circuit outputs a control signal for controlling the drive circuit to the drive circuit.

A method of manufacturing a semiconductor device according to the present disclosure includes the steps of preparing, mounting a semiconductor element, bonding the semiconductor element, mounting a terminal, and bonding the terminal. In the step of preparing, a substrate, a semiconductor element having an electrode, and a terminal having a through hole with a step portion are prepared. In the step of mounting a semiconductor element, the semiconductor element is mounted on the substrate with a first bonding material interposed. In the step of bonding the semiconductor element, the first bonding material is heated to bond the semiconductor element to the substrate with the first bonding material interposed. In the step of mounting a terminal, the terminal is mounted on the electrode of the semiconductor element with a second bonding material interposed. In the step of bonding the terminal, the second bonding material is heated to bond the terminal to the electrode with the second bonding material interposed. In the step of bonding the terminal, the second bonding material covers the step portion of the through hole and is in contact with the electrode of the semiconductor element.

A method of manufacturing a semiconductor device according to the present disclosure includes the steps of preparing, mounting a semiconductor element, mounting a terminal, and bonding. In the step of preparing, a substrate, a semiconductor element having an electrode, and a terminal having a through hole with a step portion are prepared. In the step of mounting a semiconductor element, the semiconductor element is mounted on the substrate with a first bonding material interposed. In the step of mounting a terminal, the terminal is mounted on the electrode of the semiconductor element with a second bonding material interposed. In the step of bonding, the first bonding material and the second bonding material are heated to bond the semiconductor element to the substrate with the first bonding material interposed and bond the terminal to the electrode with the second bonding material interposed. In the step of bonding, the second bonding material covers the step portion of the through hole and is in contact with the electrode of the semiconductor element.

A method of manufacturing a semiconductor device according to the present disclosure includes the steps of preparing, mounting a terminal, and bonding the terminal. In the step of preparing, a semiconductor element having an electrode, and a terminal having a through hole with a step portion are prepared. In the step of mounting a terminal, the terminal is mounted on the electrode such that the through hole overlaps the electrode of the semiconductor element. In the step of bonding the terminal, a bonding material having flowability is supplied to inside of the through hole to bond the terminal to the electrode with the bonding material interposed. In the step of bonding the terminal, the bonding material covers the step portion of the through hole and is in contact with the electrode of the semiconductor element.

The foregoing and other objects, features, aspects and advantages of the present disclosure will become more apparent from the following detailed description of the present disclosure when taken in conjunction with the accompanying drawings.

DESCRIPTION OF THE PREFERRED EMBODIMENTS

Figure 1:
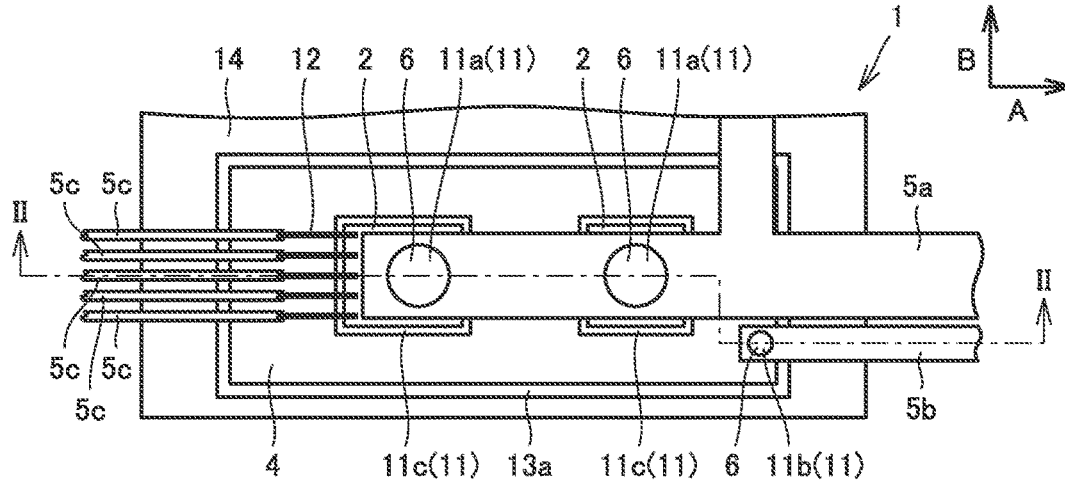
FIG. 1 is a partial plan view showing an upper surface of a semiconductor device according to a first embodiment.

Embodiments of the present disclosure will be described below. In the following drawings, the same or corresponding parts are denoted by the same reference numerals unless otherwise specified, and a description thereof is not repeated.

First Embodiment

<Configuration of Semiconductor Device>

Figure 2:
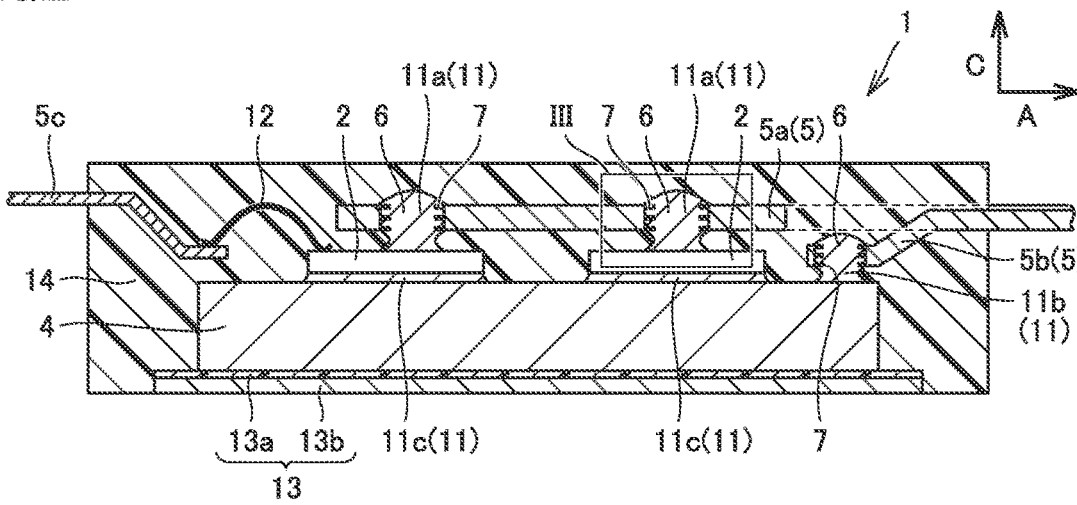
FIG. 2 is a cross-sectional view taken along line II-II in FIG. 1.
Figure 3:
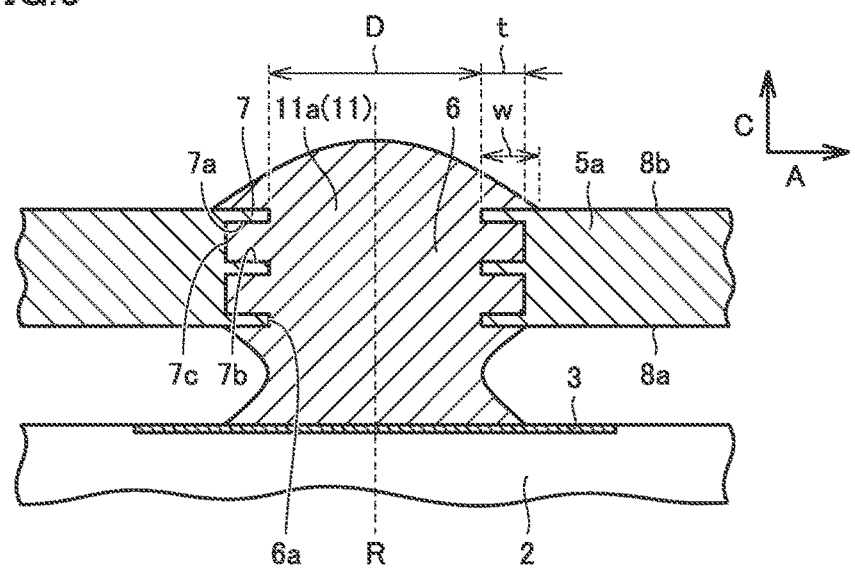
FIG. 3 is a partially-enlarged cross-sectional view of region III in FIG. 2.

FIG. 1 is a partial plan view as viewed from an upper surface of a semiconductor device 1 according to a first embodiment. FIG. 2 is a cross-sectional view taken along line II-II in FIG. 1. FIG. 3 is a partially-enlarged cross-sectional view of semiconductor device 1 in region III in FIG. 2.

Semiconductor device 1 shown in FIG. 1 to FIG. 3 is, for example, a power semiconductor device and mainly includes a semiconductor element 2, a substrate 4, a terminal 5a, a terminal 5b, a terminal 5c, a metal wire interconnection 12, a sealing resin 14, and an insulating heat dissipation sheet 13. As shown in FIG. 3, semiconductor element 2 has an electrode 3. As shown in FIG. 2, semiconductor element 2 is mounted on a surface (upper surface) of substrate 4 with a joint section 11c interposed. Semiconductor element 2 has electrode 3 on a surface (upper surface) opposite to a surface (bottom surface) opposed to substrate 4. Terminal 5a and terminal 5b each have a through hole 6. Inside of through holes 6 of terminals 5a, 5b, a plurality of recessed step portions 7 are formed on a side surface of each through hole 6. Electrode 3 is connected to terminal 5a by a joint section 11a formed of a bonding material 11. Joint section 11a fills the inside of through hole 6 to cover step portions 7 formed at the side surface of through hole 6 of terminal 5a. In other words, electrode 3 is connected to a region having through hole 6 in terminal 5a by joint section 11a.

Substrate 4 is connected to terminal 5b by a joint section 11b formed of bonding material 11. Joint section 11b fills the inside of through hole 6 to cover step portions 7 formed at the side surface of through hole 6 of terminal 5b. Substrate 4 is connected to a region having through hole 6 in terminal 5b by joint section 11b. Terminal 5c is connected to an electrode (not shown) of semiconductor element 2 through metal wire interconnection 12. Substrate 4 is connected to insulating heat dissipation sheet 13 on a surface (bottom surface) opposite to the surface having semiconductor element 2 mounted thereon.

As shown in FIG. 1 and FIG. 2, two semiconductor elements 2 are mounted on the surface of substrate 4. Two semiconductor elements 2 each include electrode 3 (see FIG. 3). Electrodes 3 of two semiconductor elements 2 are each connected to terminal 5a by joint section 11a. In other words, terminal 5a has through hole 6 in a region located above semiconductor element 2. In semiconductor device 1 shown in FIG. 1 and FIG. 2, terminal 5a has two through holes 6. Terminal 5a extends from above two semiconductor elements 2 to the outside of sealing resin 14. Terminal 5b is connected to an outer periphery of the upper surface of substrate 4 by joint section 11b. In a plan view shown in FIG. 1, terminal 5c extends along a direction in which terminal extends.

Semiconductor element 2, substrate 4, a part of terminal 5a, a part of terminal and a part of terminal 5c are covered with sealing resin 14. A part of each of terminal 5a, terminal 5b, and terminal 5c extends from the surface of sealing resin 14 to the outside so as to connect to an external device outside of sealing resin 14. Terminal 5a, terminal 5b, and terminal 5c may be bent, for example, by forming at a portion extending to the outside of sealing resin 14. The above portions of terminal 5a, terminal 5b, and terminal 5c are connected to conductors (not shown) such as interconnections or terminals for electrically connected to a circuit board or another semiconductor device. The conductor and the above portion may be connected by any method, and, for example, a fixing member such as screw may be used to fix the conductor and the above portion.

As shown in FIG. 1 and FIG. 2, the circuit configuration of semiconductor device 1 is a 2in1 type in which two semiconductor elements 2 are mounted in one module. The circuit configuration of semiconductor device 1 indicates an upper arm or a lower arm in an inverter circuit. The circuit configuration of the semiconductor device is not necessarily a 2in1 type. For example, a 1in1 type or a 6in1 type may be employed as a circuit configuration.

Semiconductor element 2 is power semiconductor element 2 for controlling power. The number of semiconductor elements 2 mounted on semiconductor device 1 is at least one or more. A plurality of semiconductor elements 2 may be mounted according to the specifications of semiconductor device 1. Semiconductor element 2 may be formed, for example, using a material such as silicon carbide (SiC), gallium nitride (GaN), gallium oxide (Ga$_2$O$_3$), or diamond. A wide-bandgap semiconductor material with a wider bandgap compared with such silicon can be used as a base material of semiconductor element 2. When a wide-bandgap semiconductor material is used as a base material, semiconductor device 1 with high efficiency and compatible with high temperatures can be obtained. In particular, when joint section 11a as bonding material 11 is a sintered material made of silver (Ag) or the like, heat resistance of joint section 11a is improved. In this case, power semiconductor element 2 of silicon carbide operable at high temperatures can be used suitably. As a result, semiconductor device 1 operable at higher temperatures than a semiconductor element made of silicon as a base material can be implemented.

Semiconductor element 2 may be of any kind. For example, an insulated gate bipolar transistor (IGBT), a metal oxide semiconductor field effect transistor (MOSFET), or a Schottky barrier diode can be used. For example, semiconductor element 2 may be a reverse conducting IGBT (RC-IGBT) having an IGBT and a freewheeling diode integrated on one semiconductor chip. The length of one side of semiconductor element 2 is, for example, 1.5 mm or more and 15 mm or less.

As shown in FIG. 2, insulating heat dissipation sheet 13 is connected on a surface opposite to the surface having semiconductor element 2 in substrate 4. The material forming substrate 4 may be any material that has high thermal conductivity. For example, substrate 4 may be formed of a metal material such as copper (Cu), aluminum (Al), or copper-molybdenum (CuMo) alloy. Substrate 4 may be formed of a composite material such as silicon carbide-aluminum composite material (AlSiC) or silicon carbide-magnesium composite material (MgSiC).

Insulating heat dissipation sheet 13 includes an insulating layer 13a and a metal layer 13b. Insulating layer 13a is connected to the bottom surface (surface opposite to the upper surface having semiconductor element 2 fixed thereon) of substrate 4. Metal layer 13b is connected to the surface opposite to the surface connected to substrate 4 in insulating layer 13a. Insulating heat dissipation sheet 13 has a laminated structure (two-layer structure) in which insulating layer 13a and metal layer 13b are laminated. In metal layer 13b, the surface opposite to the surface connected to insulating layer 13a is exposed from sealing resin 14. Insulating heat dissipation sheet 13 may not necessarily have a two-layer structure. In other words, insulating heat dissipation sheet 13 may include insulating layer 13a and a plurality of other metal layers 13b. For example, two or more metal layers 13b are laminated in insulating heat dissipation sheet 13.

The thermal conductivity of insulating heat dissipation sheet 13 is, for example, 2 W/(m·K) or more and 18

W/(m·K) or less. The thickness of insulating heat dissipation sheet 13 is, for example, 0.1 mm or more and 0.2 mm or less. Insulating layer 13a may be formed of, for example, a resin containing filler. For example, filler containing alumina (Al$_2$O$_3$), aluminum nitride (AlN), silicon nitride (Si$_3$N$_4$), silicon dioxide (SiO$_2$), or boron nitride (BN) can be used as the filler. A resin filled with the filler as described above can be used as the material of insulating layer 13a. For example, epoxy resin can be used as the resin. The material forming metal layer 13b includes a metal with high thermal conductivity. For example, copper (Cu) or aluminum (Al) can be used as the metal.

As shown in FIG. 2 and FIG. 3, terminal 5a has through hole 6. Through hole 6 is filled with bonding material 11, and joint section 11a is formed such that terminal 5a and electrode 3 of semiconductor element 2 are connected. Terminal 5a has a first main surface 8a opposed to electrode 3 of semiconductor element 2 and a second main surface 8b opposite to first main surface 8a. Joint section 11a is formed such that the interface between joint section 11a and terminal 5a extends not only on the side surface inside of through hole 6 but also on first main surface 8a and second main surface 8b of terminal 5a. Terminal 5b also has through hole 6 in the same manner as terminal 5a. Joint section 11b is formed such that terminal 5b and substrate 4 are connected in the same manner as joint section 11a.

The material forming terminal 5a, terminal 5b, and terminal 5c is, for example, copper (Cu). The material forming terminal 5a, terminal 5b, and terminal 5c is any material that has electrical conductivity as well as heat dissipation properties. For example, the material forming terminal 5a, terminal 5b, and terminal 5c may be an alloy containing copper (Cu) or aluminum (Al), or a composite material in which these metals are laminated.

The thickness of terminal 5a, terminal 5b, and terminal 5c is, for example, 0.3 mm or more and 1.2 mm or less. Terminal 5a, terminal 5b, and terminal 5c constitute an integrated lead frame until tie bar cut or lead cut is performed in a manufacturing process described later. The respective thicknesses of terminal 5a, terminal 5b, and terminal 5c in a C direction shown in FIG. 2 and the respective widths of terminal 5a, terminal 5b, and terminal 5c in a B direction shown in FIG. 1 may be changed as appropriate in accordance with the capacity of current flowing through terminal 5a, terminal 5b, and terminal 5c. For example, the capacity of current flowing through metal wire interconnection 12 connected to the electrode (control electrode) of semiconductor element 2 is relatively smaller than the capacity of current flowing through terminal 5a and terminal 5b. The thickness and width of terminal 5c therefore may be smaller than those of terminal 5a and terminal 5b. As a result, semiconductor device 1 can be reduced in size. In recent years, the capacity of current requested for semiconductor device 1 tends to be increased. For example, the rating current of semiconductor device 1 sometimes exceeds 1000 A. In such a case, the thickness of terminal 5a and terminal 5b may exceed 1.2 mm described above.

The metal forming metal wire interconnection 12 is, for example, a metal containing one selected from the group consisting of aluminum (Al), copper (Cu), silver (Ag), and gold (Au). Metal wire interconnection 12 may be a metal of an alloy selected from the above group. Metal wire interconnection 12 is bonded to terminal and the electrode of semiconductor element 2 by pressurization and ultrasonic vibrations. Metal wire interconnection 12 is an interconnection allowing current to flow for controlling semiconductor element 2. Thus, the capacity of current required for metal wire interconnection 12 is relatively small. Accordingly, the joint area between metal wire interconnection 12 and each of the electrode of semiconductor element 2 and terminal 5c can be reduced. Thus, the diameter of metal wire interconnection 12 is, for example, 0.02 mm or more and 0.2 mm or less.

The material serving as a main component of sealing resin 14 is, for example, a thermosetting resin. For example, an epoxy resin can be used as the thermosetting resin. The above material forming sealing resin 14 may be a resin having thermosetting properties as well as elasticity, adhesion, heat resistance, and insulation properties in accordance with the outer size and internal structure of semiconductor device 1. For example, in addition to epoxy resin, silicone resin, phenolic resin, polyimide resin or the like may be used as the material. Sealing resin 14 may contain dispersed fine particles or filler in order to ensure the strength and thermal conductivity as semiconductor device 1. The material of fine particles and filler may be, for example, an inorganic ceramic material. The inorganic ceramic material is, for example, alumina ($Al_2O_3$), aluminum nitride (AlN), silicon nitride ($Si_3N_4$), silicon dioxide ($SiO_2$), boron nitride (BN), diamond, silicon carbide (SiC), or boron trioxide ($B_2O_3$). Sealing resin 14 can contain fine particles or filler to improve heat dissipation from heating semiconductor element 2 to the outside of semiconductor device 1.

Here, as shown in FIG. 2 and FIG. 3, semiconductor device 1 according to the present first embodiment is characterized in that recessed step portion 7 is provided in side surface 6a of through hole 6 of each of terminal 5a and terminal 5b. Specifically, as shown in FIG. 3, step portion 7 is composed of a first step surface 7a, a second step surface 7b, and a third step surface 7c. First step surface 7a and second step surface 7b each extend to intersect side surface 6a of through hole 6. First step surface 7a and second step surface 7b face each other in parallel. First step surface 7a and second step surface 7b extend in a direction normal to side surface 6a of through hole 6.

Third step surface 7c extends in a direction along side surface 6a of through hole 6. Third step surface 7c is, for example, parallel to the extending direction of side surface 6a of through hole 6. Third step surface 7c intersects each of first step surface 7a and second step surface 7b. Third step surface 7c may be orthogonal to first step surface 7a and second step surface 7b in a cross section shown in FIG. 3. As viewed from a center axis R of through hole 6, third step surface 7c is disposed at a position farthest from the center axis R in step portion 7. Such step portion 7 is formed in side surface 6a of through hole 6 by a chemical process such as etching or a physical process such as machining. Step portion 7 is formed to extend in a circumferential direction around the center axis R on an inner peripheral surface of through hole 6. Step portion 7 may be formed all around the inner peripheral surface of through hole 6 or may be formed only at a part in the circumferential direction of the inner peripheral surface.

Figure 4:
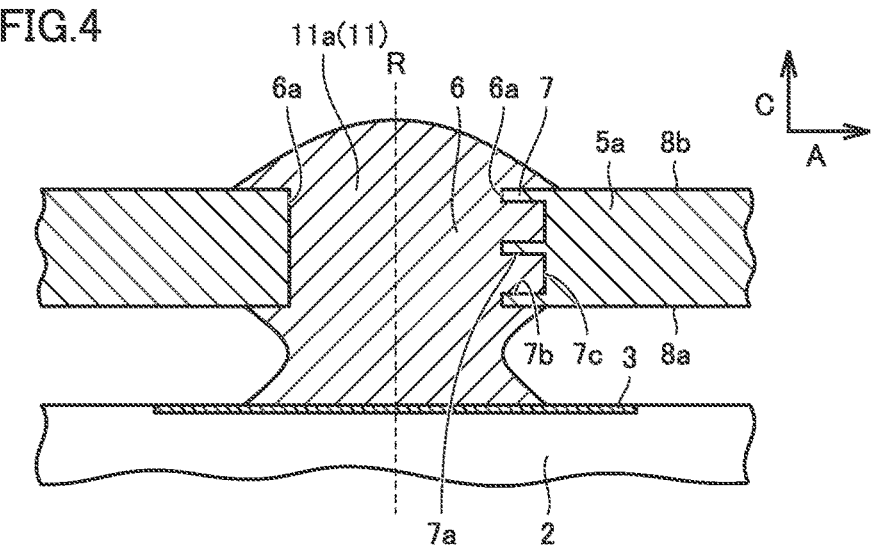
FIG. 4 is a partially-enlarged cross-sectional view showing a modification of the semiconductor device according to the first embodiment.

The provision of such step portion 7 in side surface 6a of through hole 6 increases the joint area between terminal 5a and joint section 11a to achieve an anchor effect. As a result, the bonding strength between joint section 11a and terminal 5a is significantly increased, and semiconductor device 1 with high reliability and long life can be obtained. The anchor effect can be achieved by at least one step portion 7. It is preferable to provide a plurality of step portions 7 in order to increase the anchor effect. Step portions 7 may be provided symmetrically with respect to the center axis R of through hole 6 in order to improve the anchor effect, but may be provided asymmetrically with respect to the center axis R. For example, as shown in FIG. 4, step portion 7 may be provided at only a part of side surface 6a of through hole 6.

Figure 5:
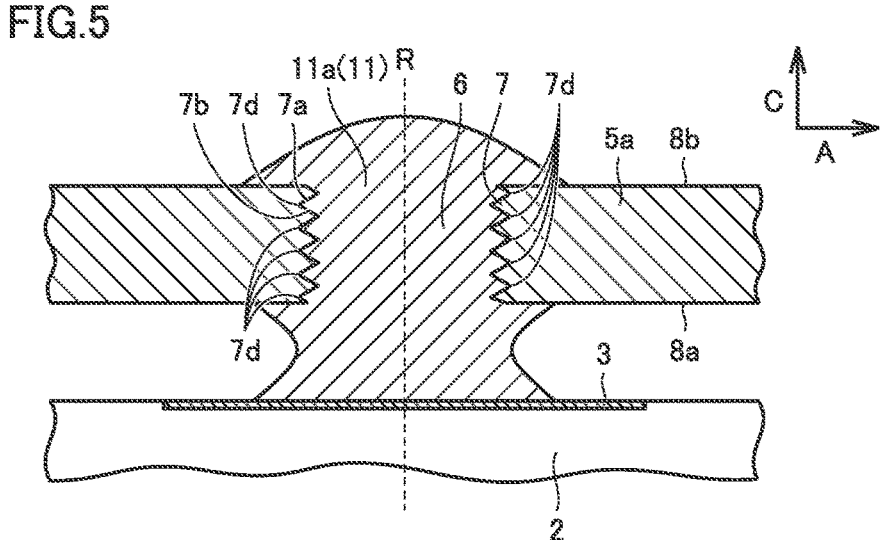
FIG. 5 is a partially-enlarged cross-sectional view showing a modification of the semiconductor device according to the first embodiment.

As shown in FIG. 5, step portion 7 shaped in a female thread may be provided in side surface 6a of through hole 6. Here, FIG. 4 and FIG. 5 are partially-enlarged cross-sectional views of a modification of semiconductor device 1 shown in FIG. 1 to FIG. 3. FIG. 4 and FIG. 5 correspond to FIG. 3. In semiconductor device 1 shown in FIG. 5, step portion 7 is composed only of first step surface 7a and second step surface 7b. The line of intersection 7d of first step surface 7a and second step surface 7b is disposed in a spiral manner around the center axis R. First step surface 7a and second step surface 7b intersect side surface 6a of through hole 6 at an angle such that first step surface 7a and second step surface 7b intersect each other. In other words, first step surface 7a and second step surface 7b are formed so as to be inclined relative to side surface 6a in a cross section including the center axis R shown in FIG. 5.

As shown in FIG. 3, a step width t that is the distance from side surface 6a of through hole 6 to third step surface 7c is substantially uniform in a plurality of step portions 7 aligned in the thickness direction (the C direction in FIG. 3) of terminal 5a. The step width t is substantially equal to a joint width w between terminal 5a and bonding material 11 at first main surface 8a and second main surface 8b of terminal 5a. The step width t may differ from the joint width w. For example, the step width t may be shorter than the joint width w between terminal 5a and bonding material 11 at first main surface 8a and second main surface 8b of terminal 5a. However, it is preferable that the step width t is 0.5 times or less of the hole diameter D of through hole 6 in order to avoid production of voids or remaining of a solvent.

Figure 6:
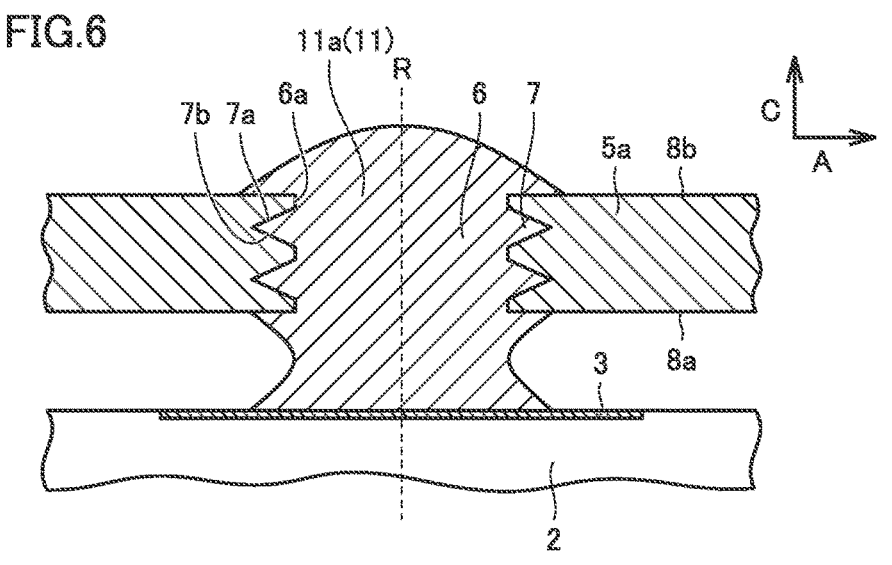
FIG. 6 is a partially-enlarged cross-sectional view showing a modification of the semiconductor device according to the first embodiment.
Figure 7:
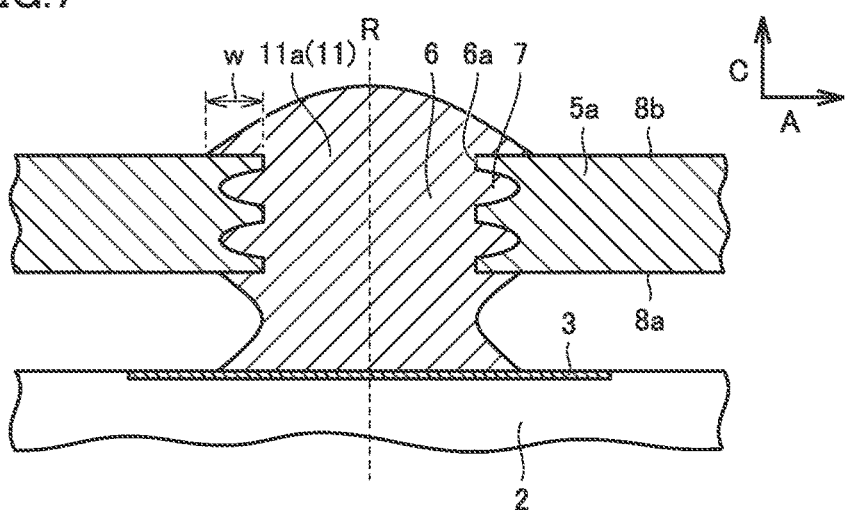
FIG. 7 is a partially-enlarged cross-sectional view showing a modification of the semiconductor device according to the first embodiment.

The shape of step portion 7 may be any shape and may be changed by processing of the step portion 7. FIG. 6 and FIG. 7 are partially-enlarged cross-sectional views of a modification of semiconductor device 1 shown in FIG. 1 to FIG. 3. FIG. 6 and FIG. 7 correspond to FIG. 3. As shown in FIG. 6, in a modification of semiconductor device 1, step portion 7 is composed only of first step surface 7a and second step surface 7b. In the cross section shown in FIG. 6, the extending direction of first step surface 7a and the extending direction of second step surface 7b intersect each other. In other words, the cross-sectional shape of step portion 7 shown in FIG. 6 is a V shape.

As shown in FIG. 7, the cross-sectional shape of step portion 7 in a cross section including the center axis R of through hole 6 may be a recessed shape having a curved surface. Step portion 7 in a recessed shape having a curved inner peripheral surface as shown in FIG. 7 can be formed by processing the inner peripheral surface of through hole 6 by a chemical process such as etching. The formation of step portion 7 in such a shape can alleviate stress and distortion produced in joint section 11a during operation of semiconductor device 1. However, attention is required because the stress and distortion produced in joint section 11a sometimes increases as the step width t of step portion 7 increases.

The material of bonding material 11 used in the above semiconductor device 1 is, for example, any one selected from the group consisting of solder, sintered material, and adhesive. In a case where solder that is a conductive metal containing tin (Sn) is used as bonding material 11, it is preferable that when solder serving as bonding material 11 is melted, the solder wets well not only the inside including step portion 7 of through hole 6 but also a region adjacent to through hole 6 at first main surface 8a and second main surface 8b of terminal 5. In this case, the joint area at the interface between bonding material 11 and terminal 5 can be increased, so that the bonding strength at the interface can be ensured. For example, as shown in FIG. 3, joint section 11a that bonds terminal 5a and semiconductor element 2 can be shaped like a rivet. In this case, the interface between joint section 11a and terminal 5a is formed to extend not only on side surface 6a of through hole 6 including step portion 7 but also to first main surface 8a and second main surface 8b of terminal 5a. In other words, a part of joint section 11a is exposed at second main surface 8b of terminal 5a. A surface of a portion of joint section 11a that protrudes from second main surface 8b of terminal 5a is formed with a curved surface.

Semiconductor element 2 generates heat during operation of semiconductor device 1. For this reason, a sintered material containing fine particles of metal including silver (Ag) or copper (Cu) excellent in heat dissipation may be used as joint section 11a that is bonding material 11. In a case where joint section 11a is a sintered material, a solvent contained in the sintered material is volatilized well in a process of heating the sintered material serving as joint section 11a disposed in the inside of through hole 6, because through hole 6 provided in terminal 5 is open at second main surface 8b that is the upper surface. Thus, the solvent can be reliably removed from the sintered material serving as joint section 11a. Such an effect can be achieved similarly in joint section 11b disposed in through hole 6 of terminal 5b. Examples of the solvent include an organic coating provided on surfaces of metal fine particles so that metal fine particles do not aggregate, and a solvent mixed with metal fine particles for making the sintered material into paste.

Here, if a large amount of solvent is left in joint section 11a after the process of heating the sintered material serving as joint section 11a, voids attributable to the solvent are produced in joint section 11a. As a result, step portion 7 is not filled with bonding material 11, and the strength of joint section 11a and joint section 11b becomes insufficient. Further, if large voids are formed in joint section 11a and joint section 11b, the reliability, lifetime, and thermal conductivity of joint section 11a and joint section 11b are deteriorated. On the other hand, in semiconductor device 1 according to the present embodiment, when a sintered material is used as bonding material 11, the solvent in the sintered material can be removed well from joint section 11a and joint section 11b in the heating process, because through hole 6 penetrates terminal 5 (through hole 6 has a shape that is not closed). Thus, the inconvenience described above can be prevented.

Figure 8:
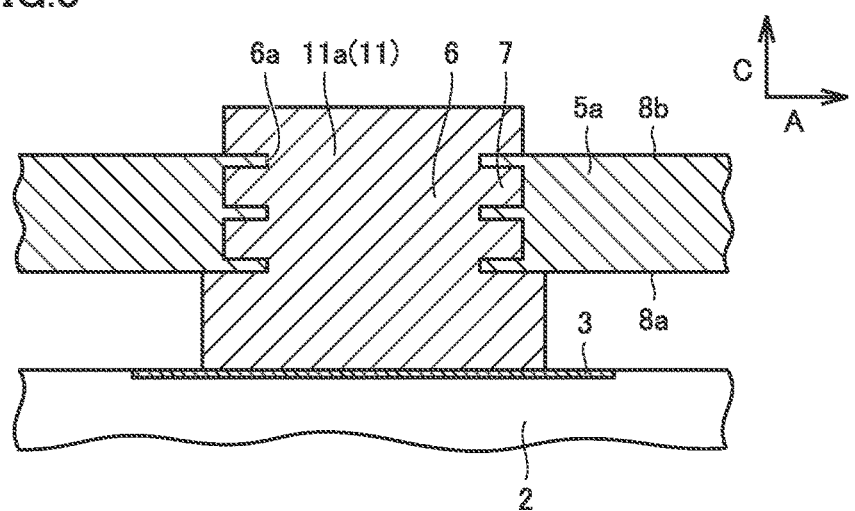
FIG. 8 is a partially-enlarged cross-sectional view showing a modification of the semiconductor device according to the first embodiment.

Since the wettability of a sintered material is inferior to the wettability of solder, the shape of joint section 11a made of a sintered material is a shape as shown in FIG. 8. Here, FIG. 8 is a partially-enlarged cross-sectional view of a modification of semiconductor device 1 shown in FIG. 1 to FIG. 3. FIG. 8 corresponds to FIG. 3. Joint section 11a of semiconductor device 1 shown in FIG. 8 is formed of a sintered material. The upper surface of joint section 11a shown in FIG. 8 is a substantially flat plane. The surface of joint section 11a disposed on each of first main surface 8a and second main surface 8b of terminal 5a extends in a direction normal to first main surface 8a or second main surface 8b.

In joint sections 11a, 11 b formed of bonding material 11, for example, when a high thermal conductivity of 100 W/(m·K) or more is not required, a sintered material or an adhesive containing resin may be used as bonding material 11. When bonding material 11 is a sintered material or an adhesive containing resin, the elasticity of joint section 11a and joint section 11b is reduced due to the resin. As a result, joint section 11a and joint section 11b with high reliability and long life can be obtained. Further, in joint section 11c that bonds semiconductor element 2 to substrate 4, a plate-shaped bonding material 11 may be used, but a paste-like bonding material 11 may be used in order to improve productivity. Paste-like bonding material 11 may be disposed on the surface of substrate 4, for example, by screen printing.

Figure 9:
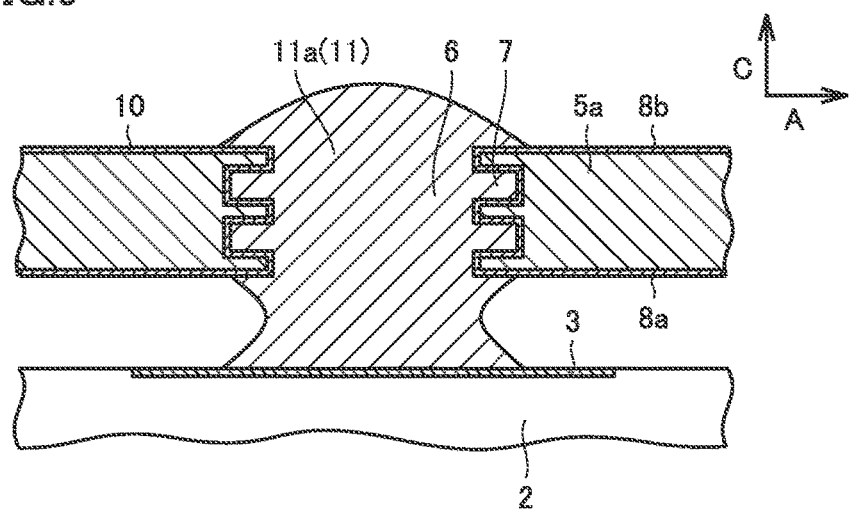
FIG. 9 is a partially-enlarged cross-sectional view showing a modification of the semiconductor device according to the first embodiment.

As shown in FIG. 9, in terminal 5a and terminal 5b, a plating layer 10 may be provided on a surface in contact with bonding material 11. FIG. 9 is a partially-enlarged cross-sectional view of a modification of semiconductor device 1 shown in FIG. 1 to FIG. 3. FIG. 9 corresponds to FIG. 3. Plating layer 10 may be any one selected from the group consisting of a nickel (Ni) plating layer, a silver (Ag) plating layer, and a tin (Sn) plating layer. The thickness of plating layer 10 is 0.001 mm or more and 0.002 mm or less. In FIG. 9, plating layer 10 is formed on the entire interface between joint section 11a and terminal 5a, but plating layer 10 may be provided partially at the interface between joint section 11a and terminal 5a and the interface between joint section 11b and terminal 5b.

<Method of Manufacturing Semiconductor Device>

Figure 10:
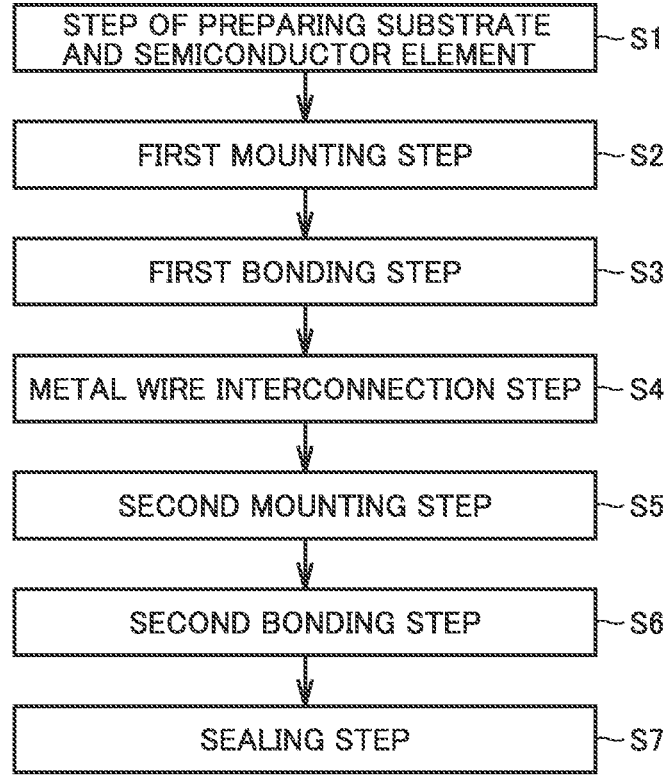
FIG. 10 is a flowchart of a method of manufacturing a semiconductor device according to the first embodiment.

FIG. 10 is a flowchart illustrating a method of manufacturing semiconductor device 1 according to the first embodiment. A method of manufacturing semiconductor device 1 will be described below. As shown in FIG. 10, in the method of manufacturing semiconductor device 1, a step of preparing substrate 4 and semiconductor element 2 (S1) is performed. In this step (S1), members necessary in the steps described later, such as substrate 4, semiconductor element 2, and bonding material 11, are prepared.

Next, a first mounting step (S2) is performed. In this step (S2), semiconductor element 2 is mounted on a surface of substrate 4 with bonding material 11 interposed as a first bonding material. Specifically, first, plate-shaped bonding material 11 corresponding to the size of the flat surface of semiconductor element 2 is disposed at a predetermined position in the surface of substrate 4. Further, semiconductor element 2 is mounted on bonding material 11. A special jig for alignment and fixing may be used, if necessary, so that substrate 4, bonding material 11, and semiconductor element 2 are not misaligned. The special jig is formed of, for example, a carbon material. The special jig has an opening for arranging substrate 4, bonding material 11, and semiconductor element 2 so that these members are easily aligned (not shown).

Next, a first bonding step (S3) is performed. In this step (S3), semiconductor element 2 and substrate 4 are bonded with bonding material 11 interposed. Specifically, substrate 4 having bonding material 11 and semiconductor element 2 mounted thereon is put into a reflow device for heating and cooling. Subsequently, bonding material 11 is melted by heating by the reflow device. Subsequently, substrate 4 having bonding material 11 and semiconductor element 2 mounted thereon is cooled. As a result, semiconductor element 2 and substrate 4 are bonded by joint section 11c formed of the solidified bonding material 11. It is necessary to perform heating and cooling in accordance with a temperature profile corresponding to a material composition of the material of bonding material 11 (for example, solder, sintered material, or adhesive). When a special jig as described above is used, the special jig is also put into the reflow device together with the above substrate 4, and heating and cooling is performed.

Next, a metal wire interconnection step (S4) is performed. In this step (S4), terminal 5c connected to the outside is connected to the electrode (control electrode) of semiconductor element 2 through metal wire interconnection 12 by a wire bonding device (see FIG. 1).

Next, a second mounting step (S5) is performed. In this step (S5), terminal 5a (see FIG. 2) is disposed on the electrode 3 (see FIG. 3) of semiconductor element 2 with bonding material 11 interposed as a second bonding material. Bonding material 11 is a plate-shaped bonding material having a size corresponding to the size of electrode 3. Terminal 5a has through hole 6 having step portion 7. Terminal 5a is aligned such that through hole 6 is positioned on bonding material 11. Further, terminal 5b (see FIG. 2) is disposed on the surface of substrate 4 with the plate-shaped bonding material 11 interposed. Terminal 5b has through hole 6 having step portion 7. Terminal 5b is aligned such that through hole 6 is positioned on bonding material 11. A special jig for alignment and fixing may be used, if necessary, so that bonding material 11 mounted on electrode 3 of semiconductor element 2, bonding material 11 mounted on the surface of substrate 4, terminal 5a, and terminal 5b are not misaligned.

Next, a second bonding step (S6) is performed. In this step (S6), electrode 3 of semiconductor element 2 and terminal 5a as well as substrate 4 and terminal 5b are bonded with bonding material 11 interposed. Specifically, substrate 4 having bonding material 11, terminal 5a, and terminal 5b mounted thereon is put into a reflow device for heating and cooling. Next, bonding material 11 is melted by heating in the reflow device. The heating temperature in this case is lower than the heating temperature in the first bonding step (S3). Subsequently, the melted bonding material 11 is cooled, whereby semiconductor element 2 and terminal 5a as well as substrate 4 and terminal are bonded by joint section 11a and joint section 11b made of bonding material 11. The heating and cooling is performed in accordance with a temperature profile corresponding to a material composition of the material of bonding material 11 (for example, solder, sintered material, and adhesive). The melting point of bonding material 11 melted in this step (S6) is lower than the melting point of bonding material 11 forming joint section 11c that is used in bonding of substrate 4 and semiconductor element 2. This is to prevent melting of bonding material 11 that has already bonded substrate 4 and semiconductor element 2 in the first bonding step (S3), in the heating in this step (S6).

After the above step (S6), joint section 11a and joint section 11b, which are disposed inside through hole 6, can be visually recognized from the upper surface (second main surface 8b) side of terminal 5a and terminal 5b, respectively. Thus, it can be easily confirmed that through hole 6 is filled with bonding material 11, from the upper surface side of semiconductor device 1 (the second main surface 8b side of terminal 5a). Further, since bonding material 11 and the member around the bonding material 11 can be identified from the upper surface side of semiconductor device 1, for example, automatic inspection by image processing can be easily performed for the state of joint section 11a and joint section 11b.

Next, a sealing step (S7) is performed. In this step (S7), semiconductor element 2 is sealed by sealing resin 14 by transfer molding. Specifically, sealing resin 14 in the shape of a tablet and insulating heat dissipation sheet 13 (see FIG. 2) are prepared. Insulating heat dissipation sheet 13 is mounted in a mold of a device that performs transfer molding. Next, substrate 4 to which semiconductor element

2, terminal 5a, terminal 5b, and terminal 5c are bonded is mounted on insulating heat dissipation sheet 13. Next, sealing resin 14 in the shape of a tablet is put into the device. Next, the inside of the mold is heated, whereby insulating heat dissipation sheet 13 and substrate 4 adhere to each other, and simultaneously, semiconductor element 2, substrate 4, and terminal 5a, terminal 5b, and terminal 5c are sealed by the melted sealing resin 14, except parts of terminal 5a, terminal 5b, and terminal 5c. Next, a curing process is performed to cure sealing resin 14. In a case where terminal terminal 5b, and terminal 5c are formed from a lead frame, tie bars, resin, and the frame of the lead frame are cut off Next, parts (tip ends) of terminal 5a, terminal 5b, and terminal 5c protruding from sealing resin 14 are bent by forming. Finally, whether the electrical characteristics as semiconductor device 1 are satisfied is inspected. In this way, semiconductor device 1 shown in FIG. 1 to FIG. 3 is produced.

Figure 11:
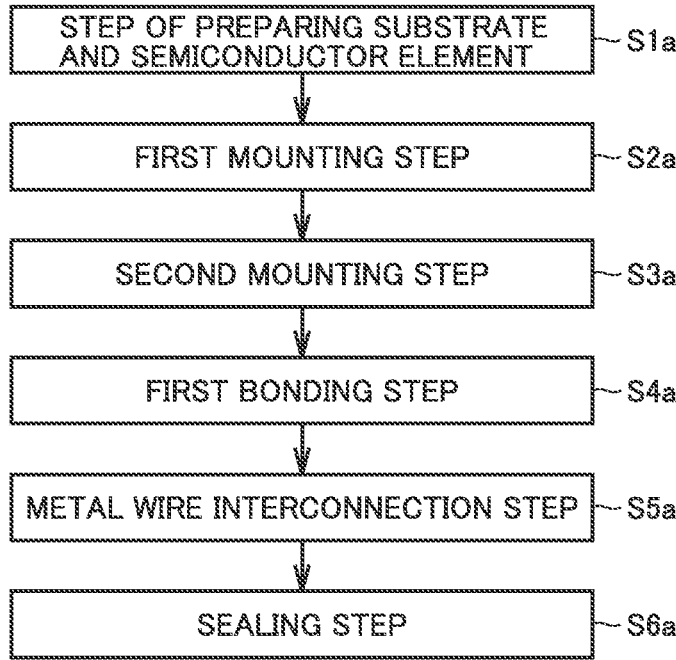
FIG. 11 is a flowchart of a modification of the method of manufacturing a semiconductor device according to the first embodiment.

A modification of the method of manufacturing semiconductor device 1 will now be described. FIG. 11 is a flowchart illustrating a modification of the method of manufacturing semiconductor device 1 according to the first embodiment. The method of manufacturing semiconductor device 1 shown in FIG. 11 basically includes steps similar to those of the method of manufacturing semiconductor device 1 shown in FIG. 10 but differs in the steps after the first mounting step (S2) shown in FIG. 10.

As shown in FIG. 11, a step of preparing substrate 4 and semiconductor element 2 (S1a) and a first mounting step (S2a) are performed in the same manner as the step (S1) and step (S2) shown in FIG. 10. Subsequently, a second mounting step (S3a) is performed. This step (S3a) is the same step as the second mounting step (S5) shown in FIG. 10. The step (S3a) may be performed prior to the step (S2a) described above.

Next, a first bonding step (S4a) is performed. In this step (S4a), the first bonding step (S3) and the second bonding step (S6) shown in FIG. 10 are simultaneously performed. In other words, substrate 4 having semiconductor element 2 and terminal 5a and terminal 5b stacked on the upper surface with bonding material 11 interposed is put into a reflow device. Through heating and cooling in the reflow device, bonding between substrate 4 and semiconductor element 2, bonding between semiconductor element 2 and terminal 5a, and bonding between substrate 4 and terminal 5b are simultaneously performed.

Subsequently, a metal wire interconnection step (S5a) and a sealing step (S6a) are performed in the same manner as the step (S4) and step (S7) shown in FIG. 10. Semiconductor device 1 shown in FIG. 1 to FIG. 3 can be obtained also in this way.

In the method of manufacturing semiconductor device 1 shown in FIG. 11, the number of times of the heating and cooling process by a reflow device can be reduced, compared with the method of manufacturing semiconductor device 1 shown in FIG. 10. As a result, the productivity in the manufacturing steps of semiconductor device 1 can be increased. Further, since the number of times of the heating and cooling process can be reduced, the thermal history of semiconductor device 1 can be suppressed. Accordingly, occurrence of defects resulting from the thermal history, for example, distortion in joint section 11c that bonds semiconductor element 2 and substrate 4, or warpage of each member of semiconductor device 1, can be suppressed. Further, in a case where a special jig is used for alignment of semiconductor element 2, bonding material 11, and terminals 5a, 5b, the alignment of those members can be performed in a batch before the step (S4a), so that the operation processes using a special jig can be reduced compared with the method of manufacturing a semiconductor device shown in FIG. 10. Further, the same bonding material 11 can be used for bonding material 11 forming joint section 11a, joint section 11b, and joint section 11c. Thus, the operation can be simplified compared with when the kind of bonding material 11 for joint section 11a and joint section 11b is changed from that of joint section 11c. In addition, inconvenience such as application of bonding material 11 of a kind different from design to each joint section can be prevented.

Operation Effects

Semiconductor device 1 according to the present disclosure includes semiconductor element 2 having electrode 3, substrate 4, terminal 5a, terminal 5b, terminal 5c, metal wire interconnection 12, and sealing resin 14. Semiconductor element 2 is mounted on substrate 4 with bonding material 11 interposed. Semiconductor element 2 has electrode 3 on a surface opposite to a surface opposed to substrate 4. Terminal 5c is connected to electrode 3 of semiconductor element 2 through metal wire interconnection 12. Terminal 5a and terminal 5b each include through hole 6 and have a plurality of recessed step portions 7 in the inside of through hole 6. Bonding material 11 covers step portions 7 in the inside of through hole 6 and is in contact with electrode 3 of semiconductor element 2. In other words, electrode 3 is connected to joint section 11a including bonding material 11 that covers step portions 7 in the inside of through hole 6 of terminal 5a. Substrate 4 is connected to joint section 11b including bonding material 11 that covers step portions 7 in the inside of through hole 6 of terminal 5b.

In this configuration, the joint area between terminal 5a and joint section 11a and the joint area between terminal 5b and joint section 11b are increased to achieve an anchor effect. Thus, the bonding strength of joint section 11a can be improved, compared with when through hole 6 has no step portions 7. As a result, semiconductor device 1 with high reliability and long life can be obtained. Further, even if cracking occurs in joint section 11a, the complicated shape of joint section 11a can suppress spread of cracking. Similar effects can also be achieved in joint section 11b.

In the above semiconductor device 1, as shown in FIG. 3, bonding material 11 extends from the inside of through hole 6 onto first main surface 8a and onto second main surface 8b. In other words, the joint section 11a bonding terminal 5a and semiconductor element 2 is formed such that the interface between joint section 11a and terminal 5a extends not only on side surface 6a of through hole 6 including step portions 7 but also to first main surface 8a and second main surface 8b of terminal 5a. In this configuration, joint section 11a is shaped like a rivet, and the bonding strength of joint section 11a is increased. Similar effects can also be achieved in joint section 11b.

The material of bonding material 11 used in the above semiconductor device 1 may contain any one selected from the group consisting of solder, sintered material, and adhesive. In a case where bonding material 11 is solder, bonding material 11 adheres to the surface of terminal 5 (side surface 6a of through hole 6 and the surface of step portions 7) because of the wettability of the solder, thereby ensuring the bonding strength between joint section 11a and terminal 5.

In a case where bonding material 11 is a sintered material using fine particles of metal including silver (Ag) or copper (Cu), joint section 11a with high heat dissipation can be obtained. Further, since through hole 6 has a shape that is not closed, the solvent contained in the sintered material can be volatilized well and the solvent can be removed from joint section 11a in the heating step for forming joint section 11a. As a result, step portions 7 of through hole 6 can be covered with bonding material 11 reliably, and formation of voids in joint section 11a can be prevented. In a case where bonding material 11 is a sintered material or an adhesive containing resin, the elasticity of joint section 11a and joint section 11b can be reduced. As a result, semiconductor device 1 with high reliability and long life can be obtained.

In the above semiconductor device 1, terminal 5a and terminal 5b each include plating layer 10 formed in a region in contact with bonding material 11. In other words, in terminals 5a, 5b, plating layer 10 may be provided on the interface with bonding material 11. The above plating layer 10 includes, as a main component, any one selected from the group consisting of nickel (Ni), silver (Ag), gold (Au), and tin (Sn). In other words, the above plating layer 10 may be any one selected from the group consisting of nickel plating, silver plating, gold plating, and tin plating. In this configuration, the adhesion of terminal 5 to bonding material 11 can be improved at the interface with joint section 11a, 11 b, thereby preventing occurrence of a not-bonded section. As a result, the bonding strength between joint section 11a, 11b and terminal can be ensured. In particular, in a case where bonding material 11 is solder, plating layer 10 improves the wettability of the solder, so that, for example, bonding material 11 can adhere well to step portions 7 of through hole 6.

Second Embodiment

Figure 12:
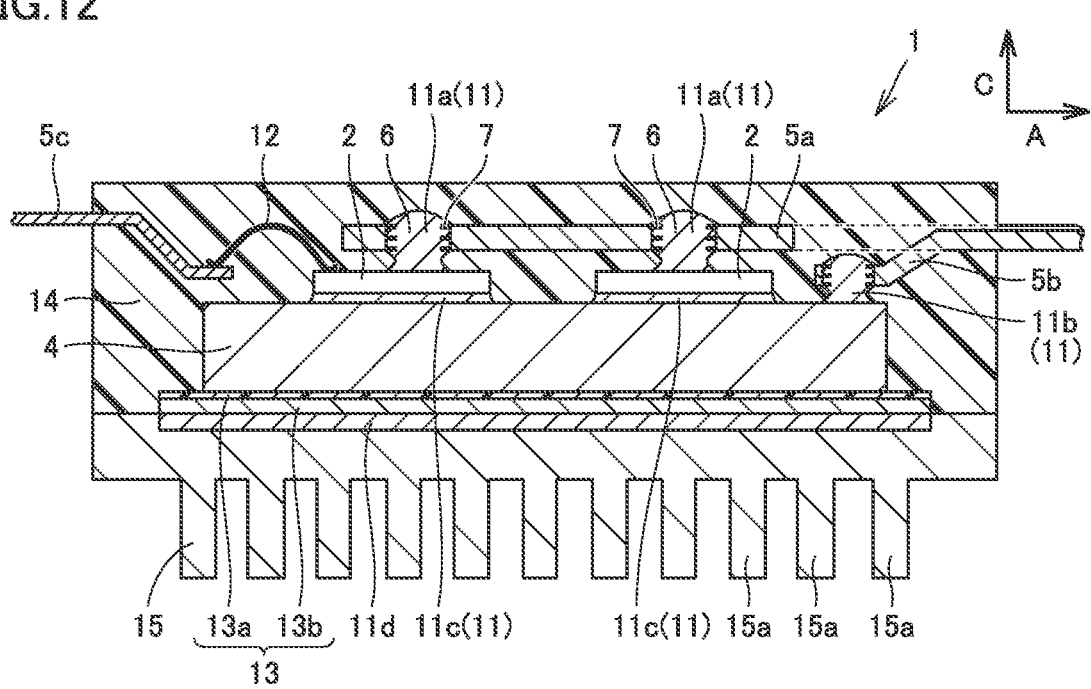
FIG. 12 is a cross-sectional view of a semiconductor device according to a second embodiment.

<Configuration of Semiconductor Device>
FIG. 12 is a cross-sectional view of semiconductor device 1 according to a second embodiment. FIG. 12 corresponds to FIG. 2. Semiconductor device 1 shown in FIG. 12 basically has a configuration similar to semiconductor device 1 shown in FIG. 1 to FIG. 3 but differs in that a cooler 15 is connected to metal layer 13b of insulating heat dissipation sheet 13. Specifically, cooler 15 is connected to metal layer 13b of insulating heat dissipation sheet 13 exposed from sealing resin 14, with a joint section 11d interposed.

When the operating temperature of semiconductor element 2 exceeds a rating value, the switching performance of semiconductor element 2 deteriorates and, in the worst case, thermal runaway occurs to cause damage to semiconductor element 2. Thus, in addition to substrate 4 with high thermal conductivity, cooler 15 is provided with insulating heat dissipation sheet 13 interposed, whereby heat dissipation and cooling performance can be improved in semiconductor device 1. For example, a material selected from the group consisting of bonding material 11 described above, thermal grease, and thermal interface material (TIM) can be disposed on the lower surface of insulating heat dissipation sheet 13, and substrate 4 and cooler 15 can be connected by joint section 11d made of the above material.

The material of cooler 15 is, for example, a metal with high thermal conductivity including aluminum (Al). Cooler 15 has a plurality of radiating fins 15a. The cooling method of cooler 15 may be air cooling or water cooling. Further, joint section 11d is not necessarily formed, and substrate 4 and cooler 15 may be integrated. In this case, since joint section 11d is not formed, there is no interface resulting from the presence of joint section 11d, so that thermal resistance at the interface can be eliminated. As a result, heat dissipation from heating semiconductor element 2 and cooling performance are improved in semiconductor device 1. In a case where substrate 4 and cooler 15 are integrated, insulating layer 13a in the shape of a flat film is provided between substrate 4 and cooler 15. The material forming insulating layer 13a may be an inorganic material selected from the group consisting of alumina ($Al_2O_3$), aluminum nitride (AlN), silicon nitride ($Si_3N_4$), silicon dioxide ($SiO_2$), and boron nitride (BN), or an organic material selected from the group consisting of epoxy resin, polyimide resin, acrylic resin, and polyphenylenesulfide (PPS) resin.

Operation Effects

The above semiconductor device 1 may include cooler 15 connected to substrate 4 with insulating heat dissipation sheet 13 interposed. Specifically, semiconductor device 1 may include cooler 15 connected to metal layer 13b of insulating heat dissipation sheet 13 exposed from sealing resin 14, with joint section 11d interposed. In this configuration, heat dissipation from heating semiconductor element 2 and cooling performance can be improved in semiconductor device 1.

The above semiconductor device 1 may include cooler 15 connected to substrate 4. Specifically, semiconductor device 1 may include cooler 15 connected directly to substrate 4 without insulating heat dissipation sheet 13 interposed. In this configuration, expensive insulating heat dissipation sheet 13 is unnecessary in production of semiconductor device 1, and therefore the production costs of semiconductor device 1 can be reduced.

Third Embodiment

<Configuration of Semiconductor Device>

Figure 13:
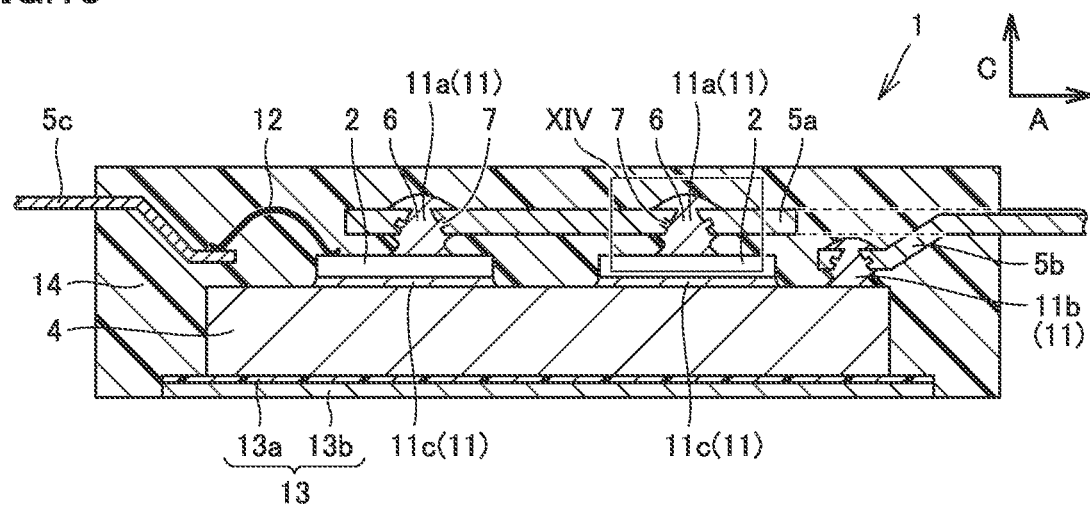
FIG. 13 is a cross-sectional view of a semiconductor device according to a third embodiment.
Figure 14:
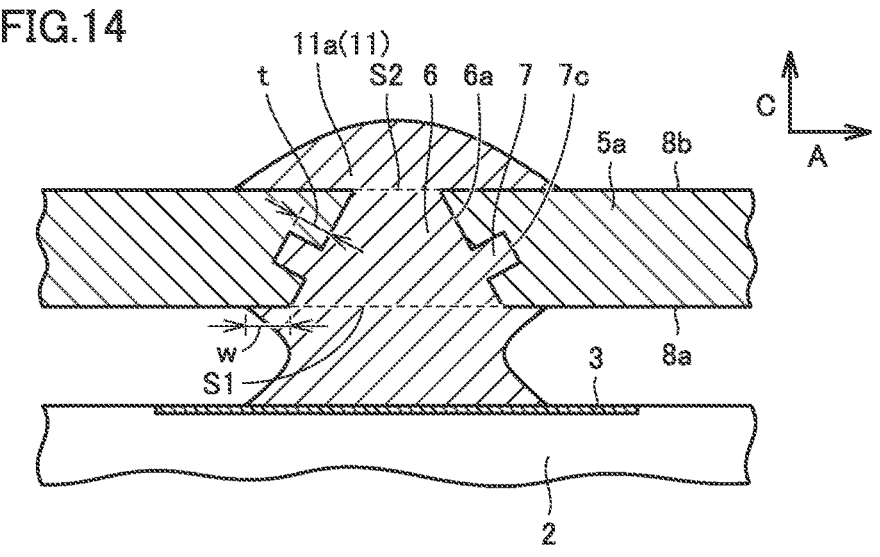
FIG. 14 is a partially-enlarged cross-sectional view of region XIV in FIG. 13.

FIG. 13 is a cross-sectional view of semiconductor device 1 according to a third embodiment. FIG. 13 corresponds to FIG. 2. FIG. 14 is a partially-enlarged cross-sectional view of region XIV in FIG. 13. FIG. 14 corresponds to FIG. 3. Semiconductor device 1 shown in FIG. 13 and FIG. 14 basically has a configuration similar to semiconductor device 1 shown in FIG. 1 to FIG. 3 but differs from semiconductor device 1 shown in FIG. 1 to FIG. 3 in the shape of through hole 6. Specifically, as shown in FIG. 14, in through hole 6 provided in terminal 5, a second opening area S2 of through hole 6 on second main surface 8b is smaller than a first opening area S1 of through hole 6 on first main surface 8a. In a different point of view, in through hole 6 provided in each of terminal 5a and terminal 5b, the width of through hole 6 on second main surface 8b is narrower than the width of through hole 6 on first main surface 8a. The extending direction of side surface 6a of through hole 6 is inclined relative to first main surface 8a. Side surface 6a of through hole 6 is inclined so as to face electrode 3 of semiconductor element 2.

As shown in FIG. 13 and FIG. 14, the number of step portions 7 having a recessed shape is one in side surface 6a of through hole 6. However, in order to improve the anchor effect, it is preferable that a plurality of step portions 7 are formed. As shown in FIG. 14, the joint width w with bonding material 11 at first main surface 8a of terminal 5a is larger than the step width t. When bonding material 11 mounted on semiconductor element 2 is heated in a reflow device, especially in a case where bonding material 11 is solder, bonding material 11 wets and spreads on first main surface 8a in a direction away from through hole 6 due to the effect of wettability of bonding material 11. This is why the joint width w with bonding material 11 at first main surface 8a is larger than the step width t.

Operation Effects

In the above semiconductor device 1, terminal 5a may have first main surface 8a facing electrode 3 of semiconductor element 2 and second main surface 8b opposite to first main surface 8a. Through hole 6 may be formed so as to extend from first main surface 8a and reach second main surface 8b. Second opening area S2 of through hole 6 on second main surface 8b may be smaller than first opening area S1 of through hole 6 on first main surface 8a. In other words, in the above semiconductor device 1, through hole 6 provided in terminal 5 is shaped such that second opening area S2 of through hole 6 on second main surface 8b is smaller than first opening area S1 of through hole 6 on first main surface 8a. In this configuration, a plate-shaped bonding material 11 can be fitted in the inside of through hole 6 from the first main surface 8a side in the manufacturing step of semiconductor device 1, so that bonding material 11 can be disposed and fixed easily.

Configuration and Operation Effects of Modification

Figure 15:
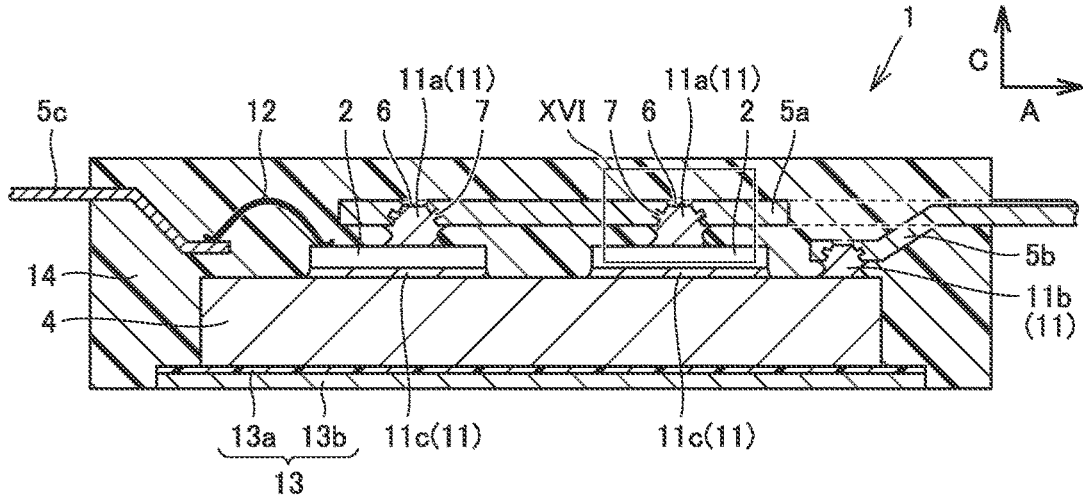
FIG. 15 is a cross-sectional view of a modification of the semiconductor device according to the third embodiment.
Figure 16:
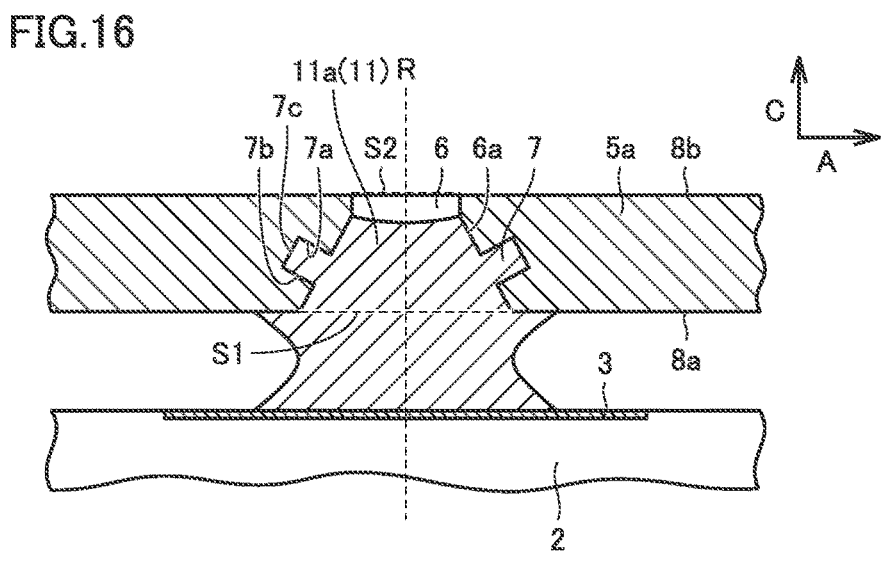
FIG. 16 is a partially-enlarged cross-sectional view of region XVI in FIG. 15.

FIG. 15 is a cross-sectional view of a modification of semiconductor device 1 according to the third embodiment. FIG. 15 corresponds to FIG. 13. FIG. 16 is a partially-enlarged cross-sectional view of region XVI in FIG. 15. FIG. 16 corresponds to FIG. 14. The semiconductor device shown in FIG. 15 and FIG. 16 basically has a configuration similar to the semiconductor device shown in FIG. 13 and FIG. 14 but differs from the semiconductor device shown in FIG. 13 to FIG. 14 in the shape of joint section 11a and joint section 11b. Specifically, as shown in FIG. 16, at joint section 11a, a top surface of bonding material 11 is disposed between step portion 7 in through hole 6 and second main surface 8b. In other words, the connection interface between joint section 11a and terminal 5a does not extend to second main surface 8b which is the upper surface of terminal 5a. Joint section 11a does not extend onto second main surface 8b. The top surface of bonding material 11 has a recessed shape as shown in FIG. 16 but may have a protruding shape depending on the material of bonding material 11 and terminal 5, the heating conditions, or the like. The top surface is formed of a curved surface. This configuration can also achieve effects similar to the effects achieved by semiconductor device 1 shown in FIG. 13 and FIG. 14.

Here, the rating current of semiconductor device 1 may exceed, for example, 1000 A as the necessary power capacity required for semiconductor device 1 tends to increase. In this case, the thickness of terminal 5 sometimes exceeds 1.2 mm. In such a case, the thermal capacity of terminal 5 is large, and the temperature gradient in the thickness direction (the C direction in FIG. 16) of terminal 5 increases due to the heat transmitted from semiconductor element 2 and bonding material 11 to terminal 5 in the heating by a reflow device. Thus, the temperature on the first main surface 8a side is higher than on the second main surface 8b side of terminal 5a and terminal 5b. As a result, bonding material 11 near first main surface 8a is kept in a melted state for a long time, whereas bonding material 11 begins to harden earlier near second main surface 8b with a relative low temperature. Joint section 11a and joint section 11b as shown in FIG. 15 and FIG. 16 are thus formed.

Fourth Embodiment

<Configuration of Semiconductor Device>

Figure 17:
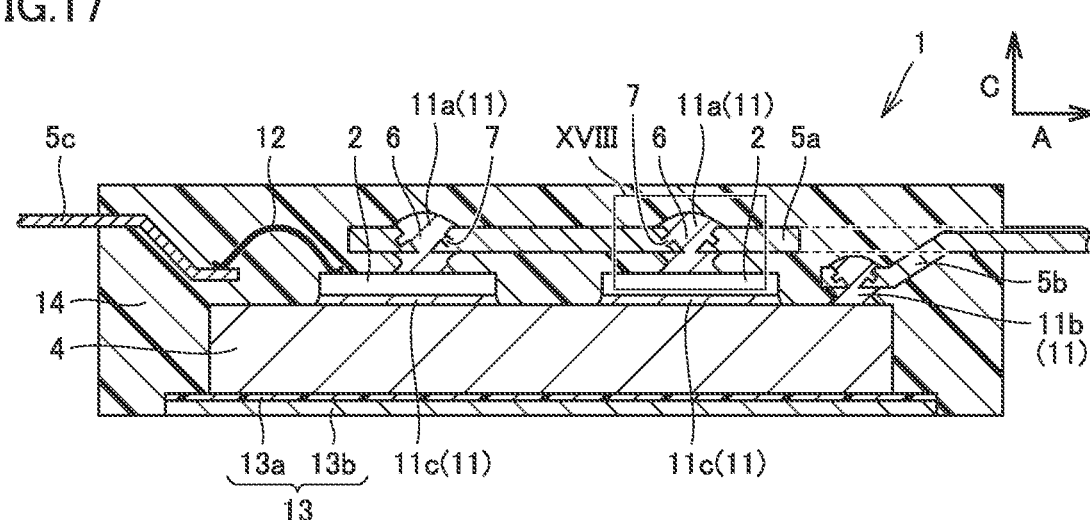
FIG. 17 is a cross-sectional view of a semiconductor device according to a fourth embodiment.
Figure 18:
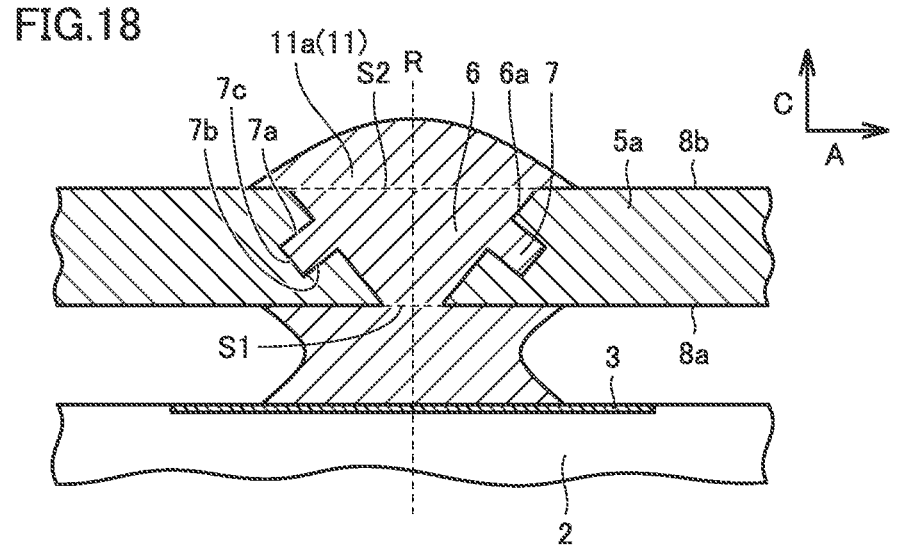
FIG. 18 is a partially-enlarged cross-sectional view of region XVIII in FIG. 17.

FIG. 17 is a cross-sectional view of semiconductor device 1 according to a fourth embodiment. FIG. 17 corresponds to FIG. 2. FIG. 18 is a partially-enlarged cross-sectional view of region XVIII in FIG. 17. FIG. 18 corresponds to FIG. 3. Semiconductor device 1 shown in FIG. 17 and FIG. 18 basically has a configuration similar to semiconductor device 1 shown in FIG. 1 to FIG. 3 but differs from semiconductor device 1 shown in FIG. 1 to FIG. 3 in the shape of through hole 6. Specifically, as shown in FIG. 18, through hole 6 provided in terminal 5 has such a shape that second opening area S2 of through hole 6 on second main surface 8b is larger than first opening area S1 of through hole 6 on first main surface 8a. In a different point of view, in through hole 6 provided in each of terminal 5a and terminal the width of through hole 6 on second main surface 8b is larger than the width of through hole 6 on first main surface 8a. The extending direction of side surface 6a of through hole 6 is inclined relative to first main surface 8a. Side surface 6a of through hole 6 is inclined so as to face the side (upper side) opposite to the electrode 3 side of semiconductor element 2 as viewed from terminal 5. Because of this shape of through hole 6, the method of manufacturing semiconductor device 1 shown in FIG. 17 and FIG. 18 is different from the method of manufacturing a semiconductor device shown in FIG. 1 to FIG. 3, as described later.

<Method of Manufacturing Semiconductor Device>

Figures 19, 20:
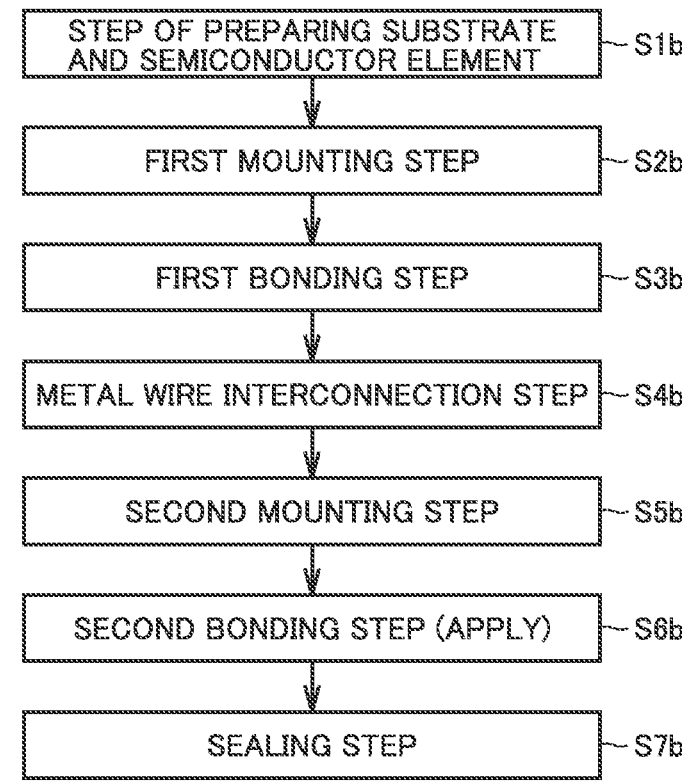
FIG. 19 is a flowchart of a method of manufacturing a semiconductor device according to the fourth embodiment.
FIG. 20 is a cross-sectional view of a semiconductor device according to a fifth embodiment.

A method of manufacturing semiconductor device 1 according to the fourth embodiment will now be described. FIG. 19 is a flowchart of a method of manufacturing semiconductor device 1 according to the fourth embodiment. The method of manufacturing semiconductor device 1 shown in FIG. 19 basically includes steps similar to those of the method of manufacturing semiconductor device 1 shown in FIG. 10 but a second mounting step (S5b) and a second bonding step (S6b) are different from the second mounting step (S5) and the second bonding step (S6) shown in FIG. 10.

As shown in FIG. 19, a step of preparing substrate 4 and semiconductor element 2 (S1b), a first mounting step (S2b), a first bonding step (S3b), and a metal wire interconnection step (S4b) are performed in the same manner as the step (S1), step (S2), step (S3), and step (S4) shown in FIG. 10. Subsequently, the second mounting step (S5b) is performed. In this step (S5b), terminal 5a is aligned with electrode 3 of semiconductor element 2 bonded to substrate 4, without mounting bonding material 11. Further, terminal 5b is aligned with substrate 4.

Next, a second bonding step (S6b) is performed. In this step (S6b), while substrate 4, semiconductor element 2, and terminal 5a and terminal 5b are heated, the melted bonding material 11 as bonding material 11 having flowability is applied, for example, by a syringe to through hole 6 from the upper surface (second main surface 8b) side of terminal 5a and terminal 5b. In this case, since second opening area S2 of through hole 6 on second main surface 8b of each of terminal 5a and terminal 5b is larger than first opening area S1 of through hole 6 on first main surface 8a, the position where the melted bonding material 11 is to be applied is easily set.

Subsequently, a sealing step (S6a) is performed in the same manner as the step (S7) shown in FIG. 10. Semiconductor device 1 shown in FIG. 17 and FIG. 18 can be obtained in this way.

Operation Effects

In the above semiconductor device 1, second opening area S2 of through hole 6 on second main surface 8b may be larger than first opening area S1 of through hole 6 on first main surface 8a in terminal 5. In other words, through hole 6 provided in terminal 5 is shaped such that second opening area S2 of through hole 6 on second main surface 8b is larger than first opening area S1 of through hole 6 on first main surface 8a. In this configuration, when the melted bonding material 11 is applied to through hole 6 from the second main surface 8b side, the application position of the melted bonding material 11 can be easily determined. Such a manufacturing method is effective, for example, in a case where it is difficult to mount and align a plate-shaped bonding material 11 on electrode 3.

For example, in a case where solder is used as bonding material 11, the solder applied on the upper surface side of through hole 6 wets and spreads to a minute portion in side surface 6a of through hole 6 because of the wettability of the solder. Thus, even when the application of the solder is slightly displaced, semiconductor element 2 and terminal 5 are bonded with no problem. In a case where a sintered material is used as bonding material 11, if a sintered material is applied by the method described above, sintering of the sintered material may proceed during the application operation. Further, also in a case where an adhesive is used as bonding material 11, curing of the adhesive may proceed if the adhesive is applied by the method described above. In this case, the viscosity of bonding material 11 may be adjusted so that it is easily applied, before bonding material 11 is applied to through hole 6 of terminal 5 at room temperature with a syringe or the like.

Fifth Embodiment

<Configuration of Semiconductor Device>

Figure 21:
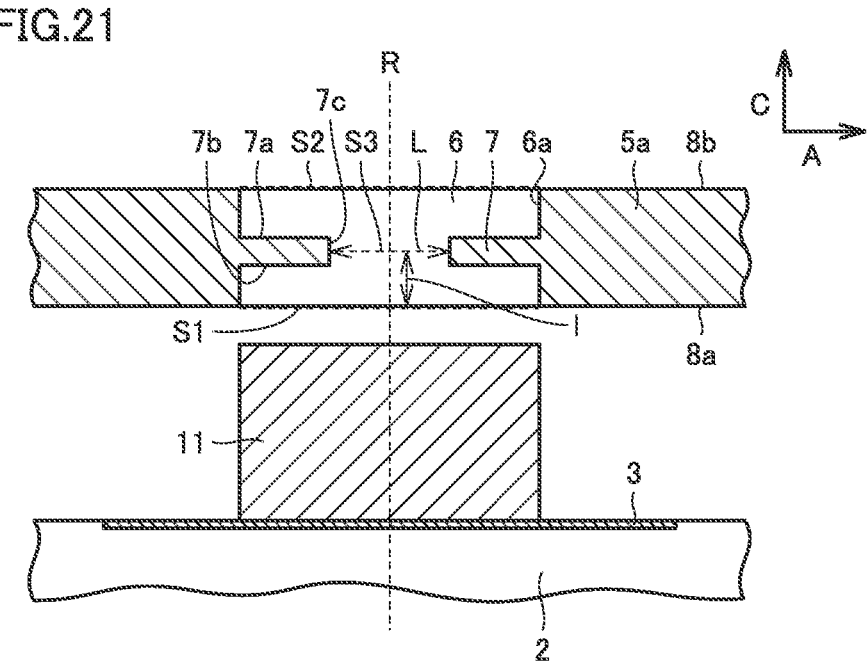
FIG. 21 is a partially-enlarged cross-sectional view of the semiconductor device according to the fifth embodiment after mounting a bonding material.
Figure 22:
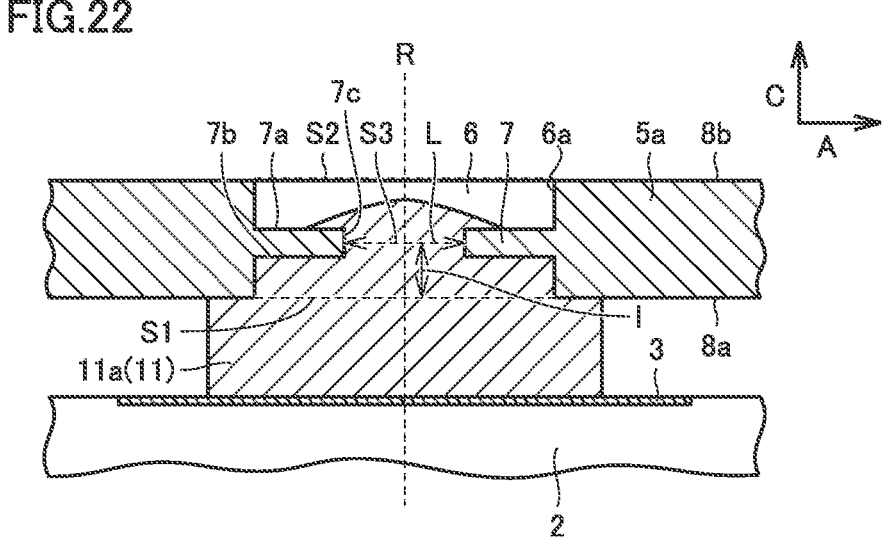
FIG. 22 is a partially-enlarged cross-sectional view of region XXII in FIG. 20.

FIG. 20 is a cross-sectional view of semiconductor device 1 according to a fifth embodiment. FIG. 20 corresponds to FIG. 2. FIG. 21 is a partially enlarged view immediately after bonding material 11 is mounted on electrode 3 of semiconductor element 2 in a method of manufacturing semiconductor device 1 according to the fifth embodiment. FIG. 22 is a partially-enlarged cross-sectional view of region XXII in FIG. 20. FIG. 22 corresponds to FIG. 3. Semiconductor device 1 shown in FIG. 20 to FIG. 22 basically has a configuration similar to semiconductor device 1 shown in FIG. 1 to FIG. 3 but differs from semiconductor device 1 shown in FIG. 1 to FIG. 3 in the shape of through hole 6. Specifically, step portion 7 having a protruding shape is formed in side surface 6a of through hole 6 in semiconductor device 1 shown in FIG. 20 to FIG. 22. In through hole 6, first opening area S1 and second opening area S2 are larger than a smallest hole area S3 in a narrow region L.

The narrow region L that is a first region is a region in the inside of through hole 6 and away from first main surface 8a by a first distance 1 in the C direction that is a direction along the center axis R of through hole 6. The narrow region L has smallest hole area S3 that is a hole area smallest in through hole 6. Step portion 7 has a protruding shape in the cross section shown in FIG. 21 (cross section including the center axis R of through hole 6). Third step surface 7c in step portion 7 is disposed at a position closest to the center axis R of through hole 6. The hole area of through hole 6 is substantially uniform except a portion where step portion 7 is present in the C direction. In other words, side surface 6a of through hole 6 is substantially normal to first main surface 8a and second main surface 8b in a region other than step portion 7.

Joint section 11a made of bonding material 11 is connected to electrode 3 of semiconductor element 2 and is in contact with a portion adjacent to through hole 6 in first main surface 8a of terminal 5a. Joint section 11a fills a region on the side closer to first main surface 8a than step portion 7 in through hole 6. A part of joint section 11a is disposed so as to extend above step portion 7. A part of joint section 11a is in contact with third step surface 7c that is an end surface of step portion 7 and first step surface 7a that is an upper surface. The upper end of bonding material 11 does not reach second main surface 8b. The upper surface of bonding material 11 is shaped like a curved surface protruding toward second main surface 8b. The shape of through hole 6 of terminal 5b and the shape of joint section 11b connected to the terminal 5b are similar to the shape of through hole 6 of terminal 5a and the shape of joint section 11a connected to the terminal 5a described above.

In a method of manufacturing semiconductor device 1 shown in FIG. 20, basically, a method similar to the method of manufacturing semiconductor device 1 shown in FIG. 1 to FIG. 3 can be used. For example, in a case where the manufacturing method shown in FIG. 10 is used, after the step (S1) to step (S4) are performed, in the second mounting step (S5), as shown in FIG. 21, a plate-shaped bonding material 11 having an area equal to or slightly smaller than first opening area S1 of through hole 6 on first main surface 8a is first mounted on electrode 3 of semiconductor element 2 and on substrate 4 (see FIG. 20). Subsequently, terminal 5a and terminal 5b are disposed such that through hole 6 overlaps the bonding material 11. By doing so, bonding material 11 overlaps through hole 6, or the upper portion of bonding material 11 is inserted into the inside of through hole 6, thereby facilitating arrangement and fixing of terminal 5a and terminal 5b to bonding material 11. Subsequently, the second bonding step (S6) in FIG. 10 is performed, whereby bonding material 11 is disposed in the inside of through hole 6 as shown in FIG. 22. Subsequently, the sealing step (S7) in FIG. 10 is performed, resulting in semiconductor device 1 shown in FIG. 20.

First opening area S1 may be different from second opening area S2. In terms of bonding strength, it is preferable that first opening area S1 is larger than second opening area S2. Further, since second opening area S2 is larger than smallest hole area S3, the manufacturing method described in the fourth embodiment may be used as the method of manufacturing semiconductor device 1 according to the present embodiment.

Operation Effects

In the above semiconductor device 1, through hole 6 may have the narrow region L serving as a first region in which the area in the radial direction of through hole 6 is smallest. First opening area S1 of through hole 6 on first main surface 8a and second opening area S2 of through hole 6 on second main surface 8b may be larger than the area in the narrow region L (smallest hole area S3). In this configuration, a plate-shaped bonding material 11 having an area equal to or slightly smaller than first opening area S1 is used to facilitate relative alignment and fixing between bonding material 11 and each of terminal 5a and terminal 5b. Further, as shown in FIG. 22, the joint section is shaped like a rivet, which increases the bonding strength of joint section 11a.

Configuration and Operation Effects of Modification

Figure 23:
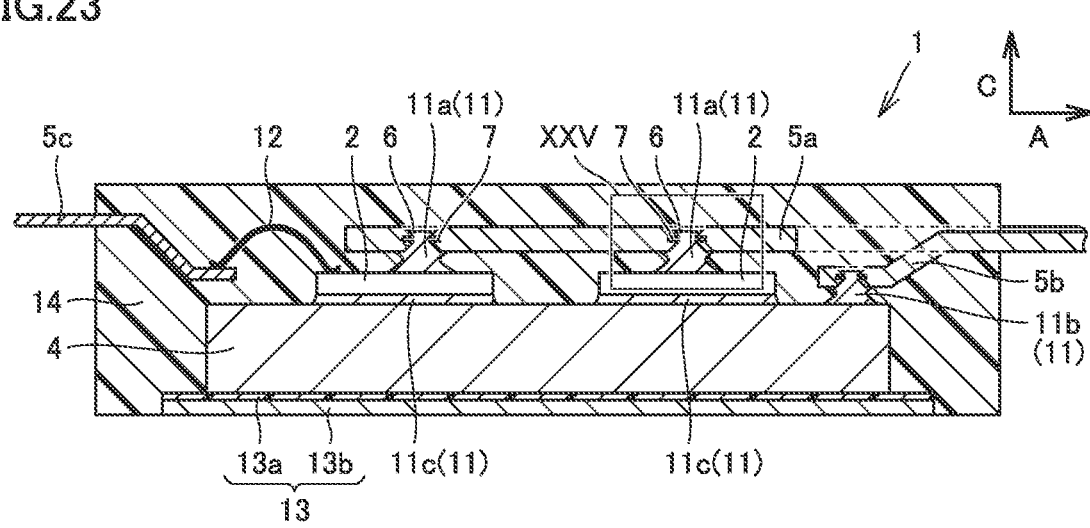
FIG. 23 is a cross-sectional view of a modification of the semiconductor device according to the fifth embodiment.
Figure 24:
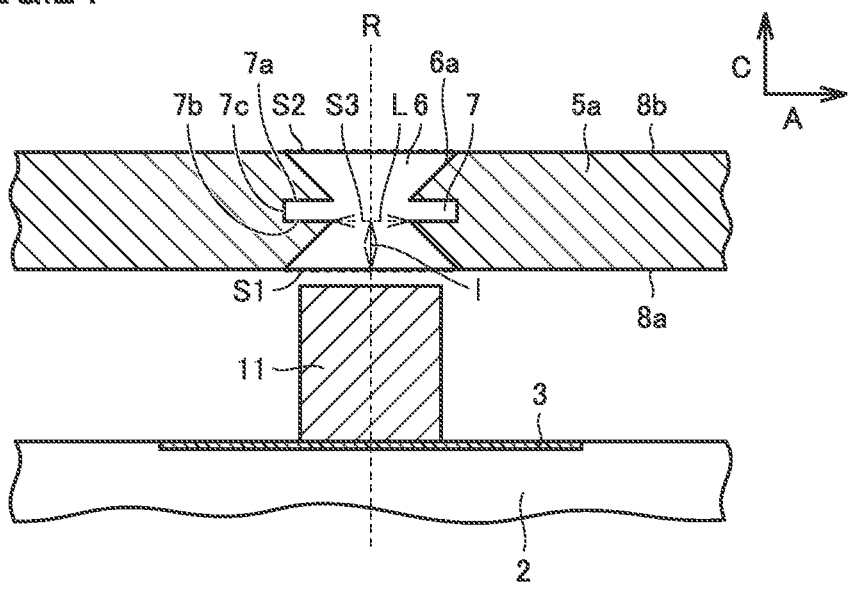
FIG. 24 is a partially-enlarged cross-sectional view of a modification of the semiconductor device according to the fifth embodiment after mounting a bonding material.
Figure 25:
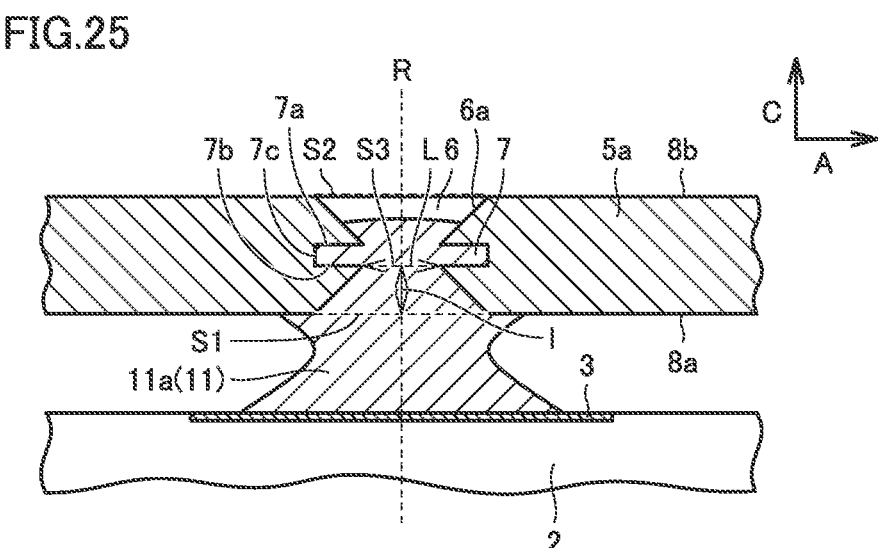
FIG. 25 is a partially-enlarged cross-sectional view of region XXV in FIG. 23.

FIG. 23 is a cross-sectional view of a modification of semiconductor device 1 according to the fifth embodiment. FIG. 23 corresponds to FIG. 20. FIG. 24 is a partially enlarged view in a state in which bonding material 11 is mounted on electrode 3 of semiconductor element 2 in a method of manufacturing semiconductor device 1 shown in FIG. 23. FIG. 24 corresponds to FIG. 21. FIG. 25 is a partially-enlarged cross-sectional view of region XXV in FIG. 23. FIG. 25 corresponds to FIG. 22.

Semiconductor device 1 shown in FIG. 23 and FIG. 25 basically has a configuration similar to semiconductor device 1 shown in FIG. 20 to FIG. 22 but differs from semiconductor device 1 shown in FIG. 20 to FIG. 22 in the shape of through hole 6. Specifically, side surface 6a is inclined relative to first main surface 8a and second main surface 8b such that the narrow region L is formed at a middle portion in a direction along the center axis R in through hole 6. In other words, side surface 6a of through hole 6 intersects first main surface 8a and second main surface 8b at an angle such that the hole area gradually increases from the narrow region L toward each of first main surface 8a and second main surface 8b. In the narrow region L, recessed step portion 7 is provided in side surface 6a. Third step surface 7c is disposed at a position farther from the center axis R than first step surface 7a and second step surface 7b. First step surface 7a and second step surface 7b extend in a direction orthogonal to the center axis R. The recessed step portion 7 is formed annularly so as to extend around the center axis R in the circumferential direction. Step portion 7 may be formed only at a part in the circumferential direction.

As shown in FIG. 25, joint section 11a made of bonding material 11 connects electrode 3 and terminal 5a in the same manner as joint section 11a shown in FIG. 22. Joint section 11a is connected to electrode 3 of semiconductor element 2 and is in contact with a portion adjacent to through hole 6 in first main surface 8a of terminal 5a. The surface (side surface) of joint section 11a located between electrode 3 and first main surface 8a is recessed and curved. Joint section 11a fills a region closer to first main surface 8a than step portion 7 in through hole 6 and the inside of step portion 7 in a recessed shape. A part of joint section 11a is disposed so as to extend above step portion 7. A part of joint section 11a is in contact with a part of side surface 6a located above step portion 7 (the second main surface 8b side). The upper end of bonding material 11 does not reach second main surface 8b. The upper surface of bonding material 11 is shaped like a curved surface protruding toward second main surface 8b. The shape of through hole 6 of terminal 5b and the shape of joint section 11b connected to the terminal 5b shown in FIG. 23 are similar to the shape of through hole 6 of terminal 5a and the shape of joint section 11a connected to the terminal 5a described above.

In a method of manufacturing semiconductor device 1 shown in FIG. 23, basically, a method similar to the method of manufacturing semiconductor device 1 shown in FIG. 20 can be used. In the method of manufacturing semiconductor device 1 shown in FIG. 23, in the second mounting step (S5) in FIG. 10, as shown in FIG. 24, a plate-shaped bonding material 11 having an area equal to or slightly smaller than first opening area S1 of through hole 6 on first main surface

8a is mounted on electrode 3 of semiconductor element 2 and on substrate 4 (see FIG. 23). Subsequently, terminal 5a and terminal 5b are disposed such that through hole 6 overlaps the bonding material 11.

In this configuration, a plate-shaped bonding material 11 having an area equal to or slightly smaller than first opening area S1 is used to facilitate arrangement and fixing of terminal 5a and terminal 5b to bonding material 11, as in the method of manufacturing semiconductor device 1 shown in FIG. 20. Further, as shown in FIG. 25, since joint section 11a, 11 b has a complicated shape (a structure in which the joint area with side surface 6a of through hole 6 is relatively large) near step portion 7, the bonding strength of joint section 11a and joint section 11b can be increased.

Sixth Embodiment

In the present embodiment, the semiconductor device according to the foregoing first to fifth embodiments is applied to a power conversion device. Although the present disclosure is not limited to any specific power conversion device, a case where the present disclosure is applied to a three-phase inverter will be described as a sixth embodiment.

Figure 26:
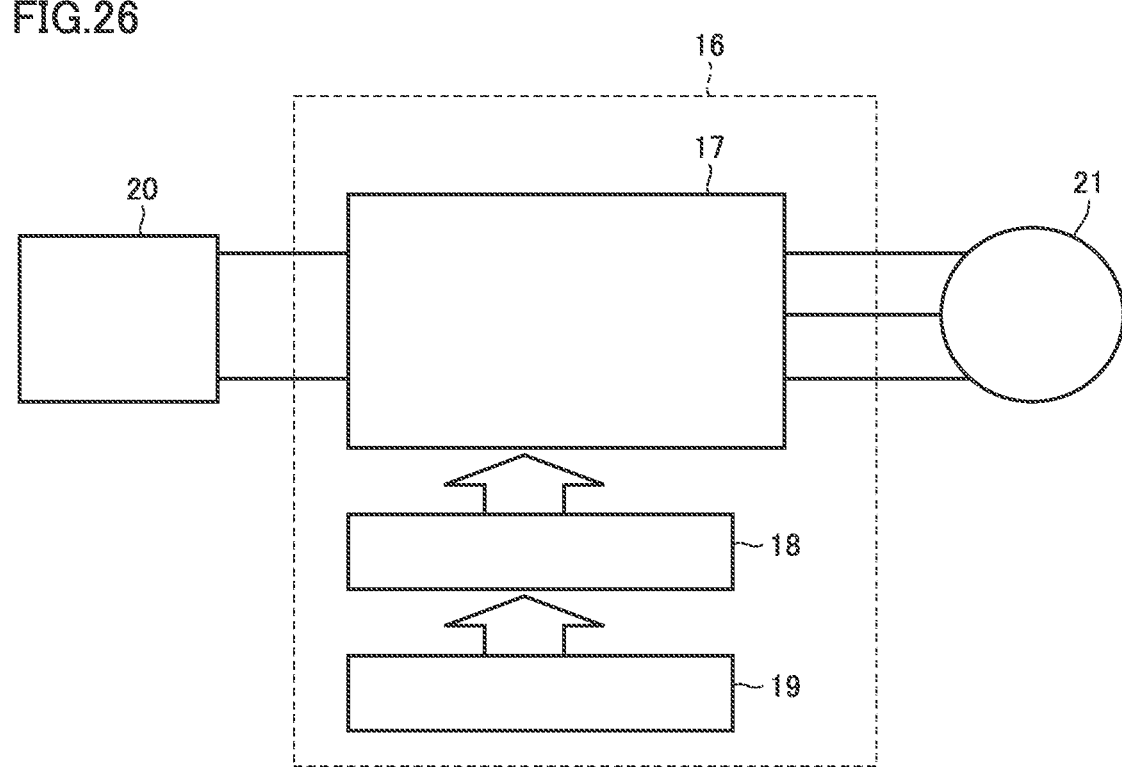
FIG. 26 is a block diagram showing a configuration of a power conversion system in which a power conversion device according to a sixth embodiment is applied.

FIG. 26 is a block diagram showing a configuration of a power conversion system in which a power conversion device according to the present embodiment is applied.

The power conversion system shown in FIG. 26 includes a power source 20, a power conversion device 16, and a load 21. Power source 20 is a DC power source to supply a DC power to power conversion device 16. Power source 20 can be configured with a variety of sources and can be configured with, for example, a DC system, a solar battery, or a storage battery or may be configured with a rectifying circuit or an AC/DC converter connected to an AC system. Power source 20 may be configured with a DC/DC converter that converts a DC power output from a DC system into a prescribed power.

Power conversion device 16 is a three-phase inverter connected between power source 20 and load 21 to convert an input DC power supplied from power source 20 into an AC power and supply the AC power to load 21. As shown in FIG. 26, power conversion device 16 includes a main conversion circuit 17 to convert a DC power into an AC power and output the AC power, a drive circuit 18 to output a drive signal for driving each switching element in main conversion circuit 17, and a control circuit 19 to output a control signal for controlling drive circuit 18 to drive circuit 18.

Load 21 is a three-phase motor driven by an AC power supplied from power conversion device 16. Load 21 is a motor not limited to any particular applications and installed in a variety of electrical instruments and used as, for example, a motor for hybrid vehicles, electric vehicles, railroad vehicles, elevators, or air conditioners.

The detail of power conversion device 16 will be described below. Main conversion circuit 17 includes switching elements and freewheeling diodes (not shown), and the switching elements perform switching to convert a DC power supplied from power source 20 into an AC power to be supplied to load 21. There are a variety of circuit configurations of main conversion circuit 17. Main conversion circuit 17 according to the present embodiment may be a two-level three-phase full bridge circuit and include six switching elements and six freewheeling diodes connected in anti-parallel with the respective switching elements. Semiconductor device 1 according to any one of the foregoing first to fifth embodiments is applied to each switching element in main conversion circuit 17. Six switching elements are connected two by two in series to form upper and lower arms, and the upper and lower arms constitute each phase (U phase, V phase, W phase) of a full-bridge circuit. The output terminals of the upper and lower arms, that is, three output terminals of main conversion circuit 17 are connected to load 21.

Drive circuit 18 generates a drive signal for driving a switching element in main conversion circuit 17 and supplies the drive signal to the control electrode of the switching element of main conversion circuit 17. Specifically, a drive signal to turn on a switching element and a drive signal to turn off a switching element are output to the control electrode of each switching element, in accordance with the control signal from control circuit 19 described later. When the switching element is kept ON, the drive signal is a voltage signal (ON signal) equal to or higher than a threshold voltage of the switching element. When the switching element is kept OFF, the drive signal is a voltage signal (OFF signal) equal to or lower than a threshold voltage of the switching element.

Control circuit 19 controls the switching elements of main conversion circuit 17 such that a desired power is supplied to load 21. Specifically, the time in which each switching element of main conversion circuit 17 is to be turned on (ON time) is calculated based on a power to be supplied to load 21. For example, main conversion circuit 17 can be controlled by PWM control that modulates the ON time of switching elements in accordance with the voltage to be output. A control command (control signal) is output to drive circuit 18 such that an ON signal is output to a switching element to be turned ON and an OFF signal is output to a switching element to be turned OFF at each point of time. Drive circuit 18 outputs an ON signal or an OFF signal as a drive signal to the control electrode of each switching element, in accordance with the control signal.

In the power conversion device according to the present embodiment, since the semiconductor device according to any one of the first to fifth embodiments is applied as each switching element in main conversion circuit 17, a power conversion device with high reliability and long life can be implemented.

In the present embodiment, a two-level power conversion device has been described. However, the present embodiment is not limited thereto and can be applied to a variety of power conversion devices. In the present embodiment, a two-level power conversion device has been described, but the first to fifth embodiments may be applied to a three-level or multi-level power conversion device, or to a single-phase inverter when a power is supplied to a single-phase load. When a power is supplied to a DC load or the like, the present disclosure can also be applied to a DC/DC converter or an AC/DC converter.

The power conversion device to which the present disclosure is applied is not limited to the case where the load is a motor, and may be used as a power supply device for electric discharge machines or laser machines, or induction heating cookers or wireless charging systems, or may be used as a power conditioner for photovoltaic systems or power storage systems.

Although embodiments of the present disclosure have been described above, embodiments disclosed here should be understood as being illustrative rather than being limitative in all respects. The scope of the present disclosure is shown by the claims, and all equivalents to the claims and modifications within the scope of the claims are intended to be embraced.

What is claimed is:

1. A semiconductor device comprising:
a semiconductor element having an electrode;
a substrate having the semiconductor element mounted thereon;
a terminal disposed to be opposed to the electrode of the semiconductor element,
the terminal including a through hole having a step portion; and
a bonding material covering the step portion inside the through hole and being in contact with the electrode of the semiconductor element.

2. The semiconductor device according to claim 1, wherein
the terminal has
a first main surface facing the electrode of the semiconductor element, and
a second main surface opposite to the first main surface,
the through hole is formed to extend from the first main surface and reach the second main surface, and
a second opening area of the through hole on the second main surface is smaller than a first opening area of the through hole on the first main surface.

3. The semiconductor device according to claim 2, wherein the bonding material extends from inside of the through hole onto the first main surface and onto the second main surface.

4. The semiconductor device according to claim 1, wherein
the terminal has
a first main surface facing the electrode of the semiconductor element, and
a second main surface opposite to the first main surface,
the through hole is formed to extend from the first main surface and reach the second main surface, and
a second opening area of the through hole on the second main surface is larger than a first opening area of the through hole on the first main surface.

5. The semiconductor device according to claim 1, wherein
the terminal has
a first main surface facing the electrode of the semiconductor element, and
a second main surface opposite to the first main surface,
the through hole is formed to extend from the first main surface and reach the second main surface, and
the through hole has a first region in which an area in a radial direction of the through hole is smallest, and
a first opening area of the through hole on the first main surface and a second opening area of the through hole on the second main surface are larger than the area in the first region.

6. The semiconductor device according to claim 1, wherein a material forming the bonding material includes any one selected from the group consisting of solder, sintered material, and adhesive.

7. The semiconductor device according to claim 1, wherein the terminal includes a plating layer formed in a region in contact with the bonding material.

8. The semiconductor device according to claim 7, wherein the plating layer includes at least one selected from the group consisting of nickel, silver, gold, and tin as a main component.

9. The semiconductor device according to claim 1, wherein the substrate includes aluminum or copper as a main component.

10. The semiconductor device according to claim 1, further comprising an insulating heat dissipation sheet connected to a surface opposite to a surface having the semiconductor element in the substrate, wherein
the insulating heat dissipation sheet includes
an insulating layer and
a metal layer laminated on the insulating layer.

11. The semiconductor device according to claim 10, further comprising a cooler connected to the substrate with the insulating heat dissipation sheet interposed.

12. The semiconductor device according to claim 1, further comprising a cooler connected to the substrate.

13. The semiconductor device according to claim 1, further comprising a sealing resin covering the semiconductor element, the substrate, and a part of the terminal.

14. The semiconductor device according to claim 1, wherein the semiconductor element is an insulated gate bipolar transistor.

15. The semiconductor device according to claim 1, wherein the semiconductor element includes a wide-band-gap semiconductor.

16. A power conversion device comprising:
a main conversion circuit having the semiconductor device according to claim 1, the main conversion circuit converting input power and outputting the converted power;
a drive circuit to output a drive signal for driving the semiconductor device to the semiconductor device; and
a control circuit to output a control signal for controlling the drive circuit to the drive circuit.

17. A method of manufacturing a semiconductor device, the method comprising:
preparing a substrate, a semiconductor element having an electrode, and a terminal having a through hole with a step portion;
mounting the semiconductor element on the substrate with a first bonding material interposed;
heating the first bonding material to bond the semiconductor element to the substrate with the first bonding material interposed;
mounting the terminal on the electrode of the semiconductor element with a second bonding material interposed; and
heating the second bonding material to bond the terminal to the electrode with the second bonding material interposed,
wherein in the bonding of the terminal, the second bonding material covers the step portion of the through hole and is in contact with the electrode of the semiconductor element.

18. A method of manufacturing a semiconductor device, the method comprising:
preparing a substrate, a semiconductor element having an electrode, and a terminal having a through hole with a step portion;
mounting the semiconductor element on the substrate with a first bonding material interposed;
mounting the terminal on the electrode of the semiconductor element with a second bonding material interposed; and
heating the first bonding material and the second bonding material to bond the semiconductor element to the substrate with the first bonding material interposed and bond the terminal to the electrode with the second bonding material interposed, wherein in the bonding, the second bonding material covers the step portion of the through hole and is in contact with the electrode of the semiconductor element.

19. A method of manufacturing a semiconductor device, the method comprising:

preparing a semiconductor element having an electrode, and a terminal having a through hole with a step portion;

mounting the terminal on the electrode such that the through hole overlaps the electrode of the semiconductor element; and supplying a bonding material having flowability to inside of the through hole to bond the terminal to the electrode with the bonding material interposed, wherein in the bonding of the terminal, the bonding material covers the step portion of the through hole and is in contact with the electrode of the semiconductor element.

\* \* \* \* \*